(12) United States Patent
Liang et al.

(10) Patent No.: US 12,446,271 B2
(45) Date of Patent: Oct. 14, 2025

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Chun-Sheng Liang, Changhua (TW); Hong-Chih Chen, Changhua (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 466 days.

(21) Appl. No.: 18/097,253

(22) Filed: Jan. 15, 2023

(65) Prior Publication Data
US 2024/0105786 A1    Mar. 28, 2024

(51) Int. Cl.
*H10D 62/00* (2025.01)
*H10D 30/01* (2025.01)
*H10D 30/43* (2025.01)
*H10D 30/67* (2025.01)
*H10D 62/10* (2025.01)
*H10D 64/01* (2025.01)
(Continued)

(52) U.S. Cl.
CPC ......... *H10D 62/021* (2025.01); *H10D 30/014* (2025.01); *H10D 30/43* (2025.01); *H10D 30/6729* (2025.01); *H10D 30/6757* (2025.01); *H10D 62/121* (2025.01); *H10D 64/017* (2025.01); *H10D 84/013* (2025.01); *H10D 84/0158* (2025.01); *H10D 84/038* (2025.01)

(58) Field of Classification Search
CPC .................. H10D 30/01; H10D 30/014; H10D 30/019–0198; H10D 30/43; H10D 30/435; H10D 30/501–509; H10D 30/6729; H10D 30/674; H10D 30/6757; H10D 30/797; H10D 62/021; H10D 62/121; H10D 62/822; H10D 62/83; H10D 84/01; H10D 84/013; H10D 84/0149; H10D 84/0158; H10D 84/038; H10D 84/8311; H10D 84/8312; H10D 84/83125; H10D 84/83135; H10D 84/83138; H10D 84/8314; H10D 84/8316; H10D 84/832–833; H10D 84/834; H10D 84/835; H10D 84/836; H10D 84/837–839
See application file for complete search history.

(56) References Cited

U.S. PATENT DOCUMENTS 9,209,247 B2   12/2015   Colinge et al.
9,236,267 B2    1/2016   De et al.
9,412,817 B2    8/2016   Yang et al.
(Continued)

*Primary Examiner* — Cheung Lee
(74) *Attorney, Agent, or Firm* — NZ Carr Law Office

(57) ABSTRACT

A semiconductor device structure, along with methods of forming such, are described. The structure includes a first source/drain (S/D) region disposed over a substrate, a second S/D region disposed over the substrate, a dielectric wall disposed between the first and second S/D regions, a first conductive contact disposed over and electrically connected to the first S/D region, a second conductive contact disposed over and electrically connected to the second S/D region, and a first dielectric material in contact with the dielectric wall. The first dielectric material has a top surface located at a first level between a top surface of the first conductive contact and a bottom surface of the first conductive contact, and the first dielectric material extends from the first level to a second level located below the bottom surface of the first conductive contact.

20 Claims, 23 Drawing Sheets

(51) Int. Cl.
*H10D 84/01* (2025.01)
*H10D 84/03* (2025.01)

(56) References Cited

U.S. PATENT DOCUMENTS

| | | |
|---|---|---|
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2019/0164741 A1 | 5/2019 | Wen et al. |
| 2021/0376076 A1 | 12/2021 | Su et al. |

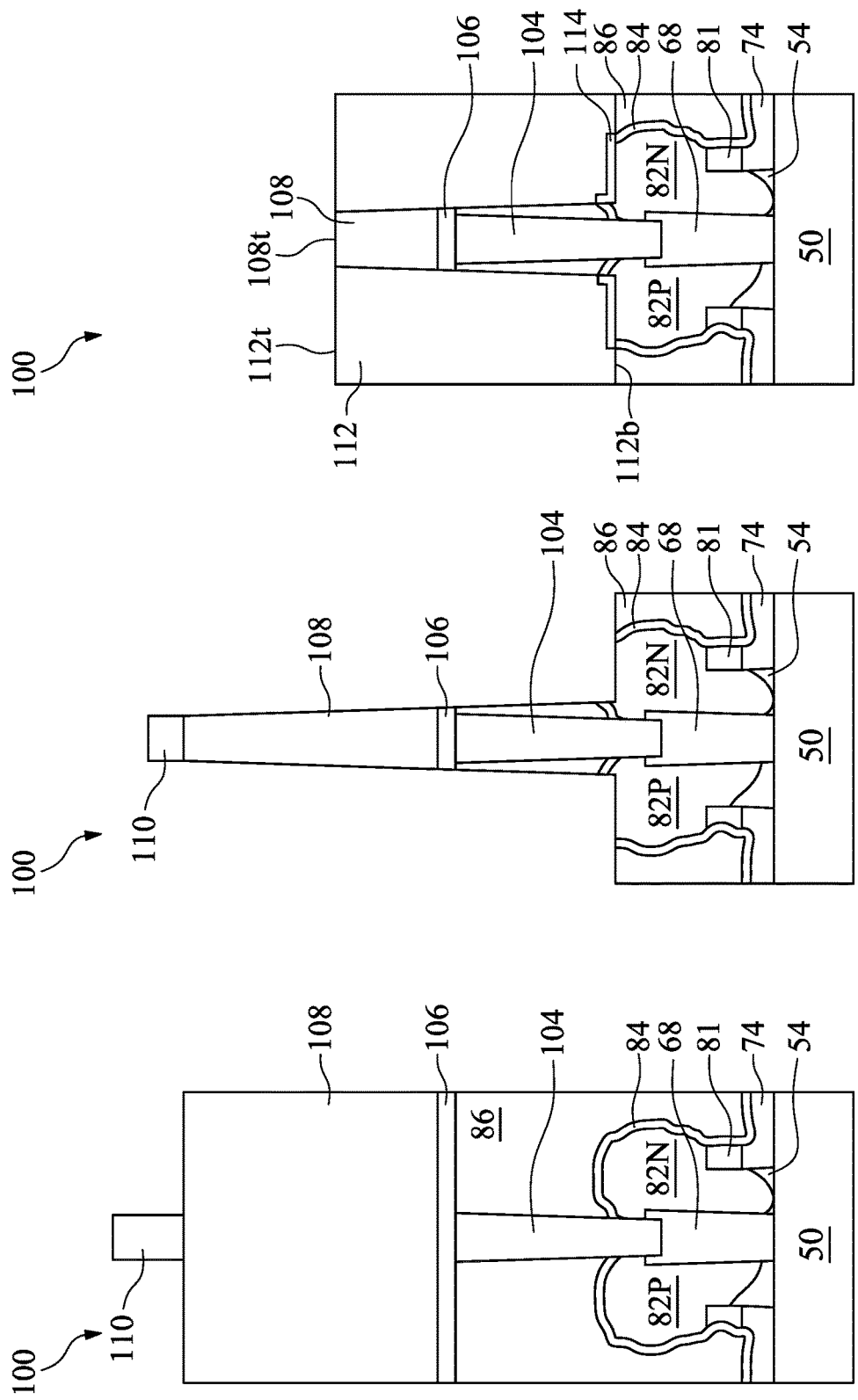

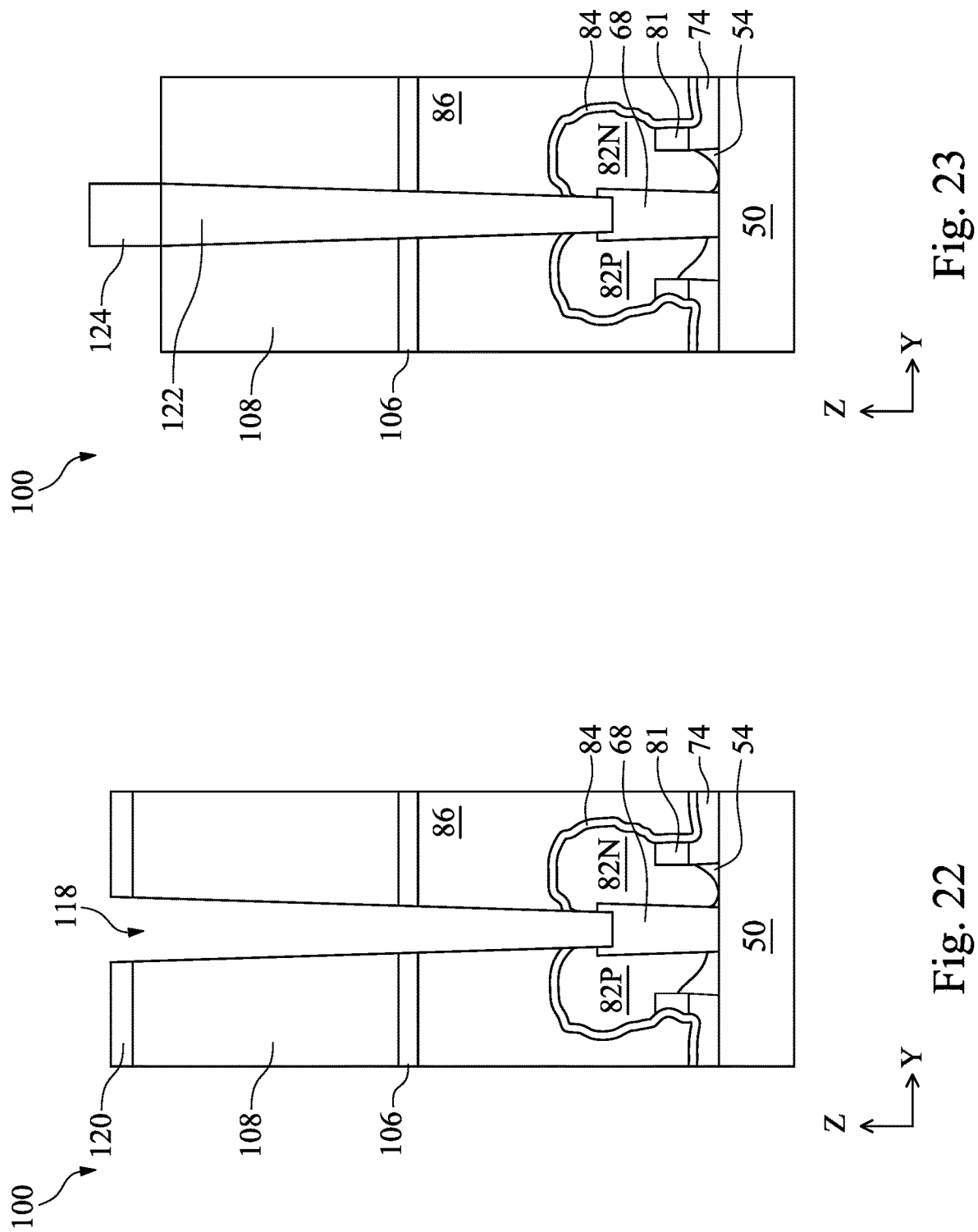

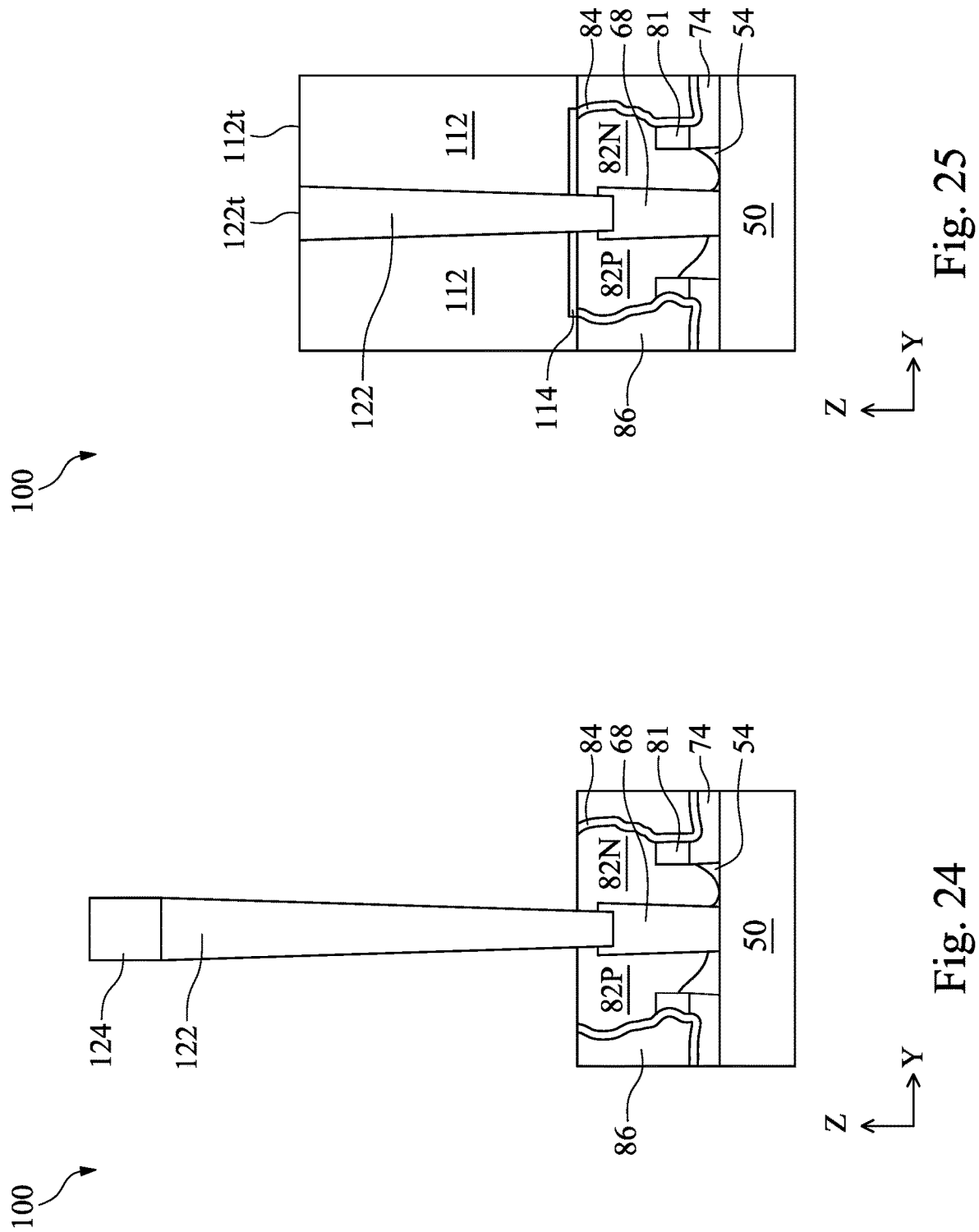

SEMICONDUCTOR DEVICE STRUCTURE AND METHODS OF FORMING THE SAME

CROSS-REFERENCE TO RELATED APPLICATIONS

This application claims priority to U.S. Provisional Application Ser. No. 63/410,326 filed Sep. 27, 2022, which is incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8A-13A are cross-sectional side views of various stages of manufacturing the semiconductor device structure taken along line A-A of FIG. 7, in accordance with some embodiments.

FIGS. 8B-13B are cross-sectional side views of various stages of manufacturing the semiconductor device structure taken along line B-B of FIG. 7, in accordance with some embodiments.

FIGS. 8C-13C are cross-sectional side views of various stages of manufacturing the semiconductor device structure taken along line C-C of FIG. 7, in accordance with some embodiments.

FIGS. 14-16 are cross-sectional side views of various stages of manufacturing the semiconductor device structure taken along line C-C of FIG. 7, in accordance with some embodiments.

FIGS. 17A-19A are cross-sectional side views of various stages of manufacturing the semiconductor device structure taken along line A-A of FIG. 7, in accordance with alternative embodiments.

FIGS. 17B-19B are cross-sectional side views of various stages of manufacturing the semiconductor device structure taken along line B-B of FIG. 7, in accordance with alternative embodiments.

FIGS. 17C-19C are cross-sectional side views of various stages of manufacturing the semiconductor device structure taken along line C-C of FIG. 7, in accordance with alternative embodiments.

FIGS. 22-25 are cross-sectional side views of various stages of manufacturing the semiconductor device structure taken along line C-C of FIG. 7, in accordance with some embodiments.

DETAILED DESCRIPTION

Figure 1:
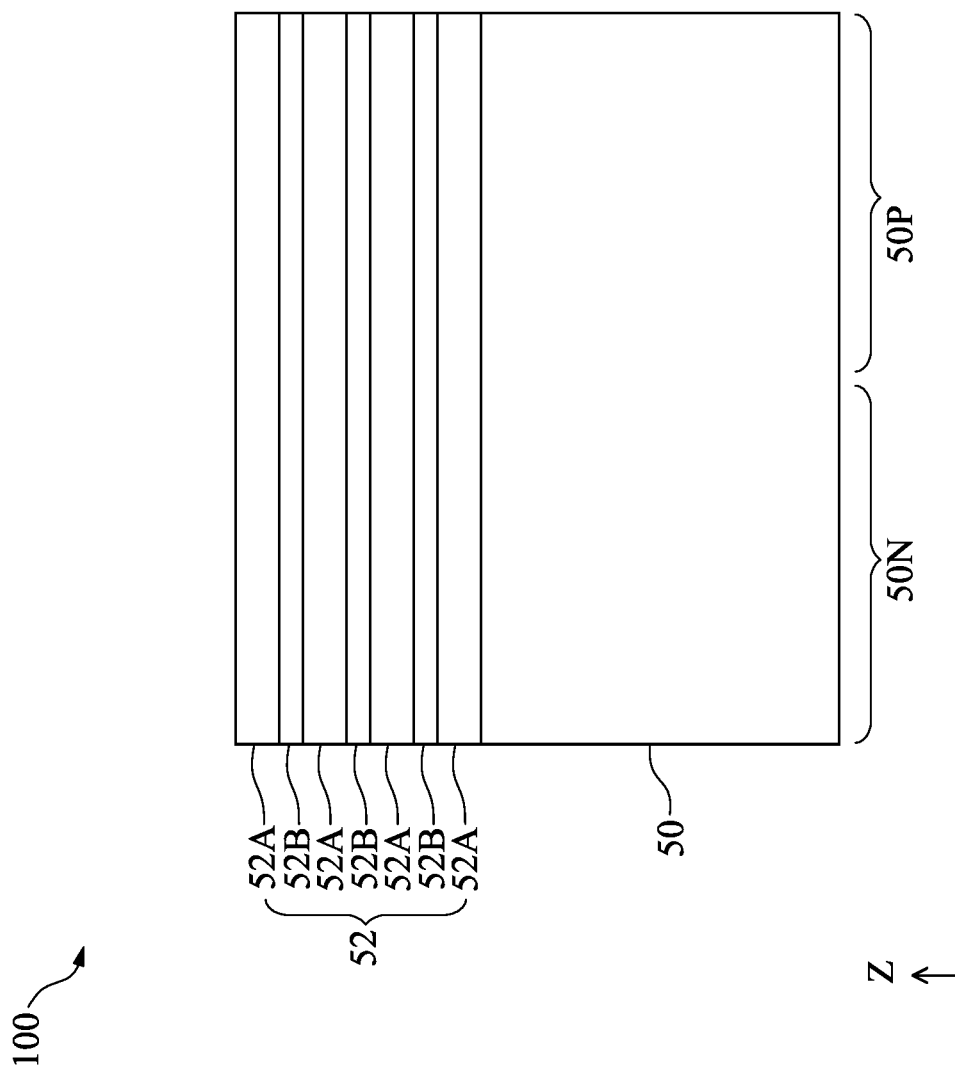
FIGS. 1-6 are cross-sectional side views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-6 are cross-sectional side views of various stages of manufacturing a semiconductor device structure 100, in accordance with some embodiments. As shown in FIG. 1, the semiconductor device structure 100 includes a substrate 50 and a multi-layer stack 52 is formed over the substrate 50. The substrate 50 may be a semiconductor substrate, such as a bulk semiconductor, a semiconductor-on-insulator (SOI) substrate, or the like, which may be doped (e.g., with a p-type or a n-type dopant) or undoped. The substrate 50 may be a semiconductor wafer, such as a silicon wafer. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a n-type region 50N and a p-type region 50P. The n-type region 50N can be for forming n-type devices, such as NMOS transistors, e.g., n-type field effect transistors (FETs) (NFETs), and the p-type region 50P can be for forming p-type devices, such as PMOS transistors, e.g., p-type FETs (PFETs). As discussed in greater detail below, although one n-type region 50N and one p-type region 50P are illustrated, the substrate 50 can include any desired quantity of such regions.

As shown in FIG. 1, the multi-layer stack 52 includes alternating first semiconductor layers 52A and second semiconductor layers 52B. The first semiconductor layers 52A are formed of a first semiconductor material, and the second semiconductor layers 52B are formed of a second semiconductor material different from the first semiconductor material. The semiconductor materials may each be selected from the candidate semiconductor materials of the substrate 50. In the illustrated embodiment, the multi-layer stack 52 includes four layers of each of the first semiconductor layers 52A and the second semiconductor layers 52B. It should be appreciated that the multi-layer stack 52 may include any number of the first semiconductor layers 52A and the second semiconductor layers 52B. For example, the multi-layer stack 52 may include from about three to about eight layers of each of the first semiconductor layers 52A and the second semiconductor layers 52B.

In the illustrated embodiment, the second semiconductor layers 52B will be used to form channel regions for transistors in both the n-type region 50N and the p-type region 50P. In some embodiments, the transistors are FETs, such as nanostructure FETs each having a plurality of channels wrapped around by the gate electrode layer. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The channel(s) of the semiconductor device structure 100 may be surrounded by the gate electrode layer. The nanostructure transistors may be referred to as nanosheet transistors, nanowire transistors, gate-all-around (GAA) transistors, multi-bridge channel (MBC) transistors, or any transistors having the gate electrode layer surrounding the channels. In some embodiments, the transistors may be planar FETs, FinFETs, complementary FETs (CFETs), forksheet FETs, or other suitable devices.

The first semiconductor layers 52A are sacrificial layers (or dummy layers), which will be removed in subsequent processing to expose the top surfaces and the bottom surfaces of the second semiconductor layers 52B in both regions. In some embodiments, the second semiconductor material of the second semiconductor layers 52B is a material suitable for both n-type and p-type nano-FETs, such as silicon, and the first semiconductor material of the first semiconductor layers 52A is a material that has a high etching selectivity from the etching of the second semiconductor material, such as silicon germanium.

In another embodiment, the first semiconductor layers 52A will be used to form channel regions for the transistors in one region (e.g., the p-type region 50P), and the second semiconductor layers 52B will be used to form channel regions for the nano-FETs in another region (e.g., the n-type region 50N). The first semiconductor material of the first semiconductor layers 52A may be suitable for p-type FETs, such as silicon germanium (e.g., $Si_xGe_{1-x}$, where x can be in the range of 0 to 1), pure or substantially pure germanium, a III-V compound semiconductor, a II-VI compound semiconductor, or the like, and the second semiconductor material of the second semiconductor layers 52B may be suitable for n-type nano-FETs, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 52A may be removed without removing the second semiconductor layers 52B in the n-type region 50N, and the second semiconductor layers 52B may be removed without removing the first semiconductor layers 52A in the p-type region 50P.

Each of the layers of the multi-layer stack 52 may be grown by a process such as vapor phase epitaxy (VPE) or molecular beam epitaxy (MBE), deposited by a process such as chemical vapor deposition (CVD) or atomic layer deposition (ALD), or the like. Each of the layers may be formed to a small thickness, such as a thickness in the range of about 5 nm to about 30 nm. In some embodiments, one group of layers (e.g., the second semiconductor layers 52B) is formed to be thinner than another group of layers (e.g., the first semiconductor layers 52A). For example, in some embodiments where the first semiconductor layers 52A are sacrificial layers (or dummy layers) and the second semiconductor layers 52B are used to form channel regions, the second semiconductor layers 52B can be thicker than the first semiconductor layers 52A. The relative thicknesses of the layers can be based on the desired channel height and the channel work function requirements of the resulting nanostructure FETs.

Figure 2:
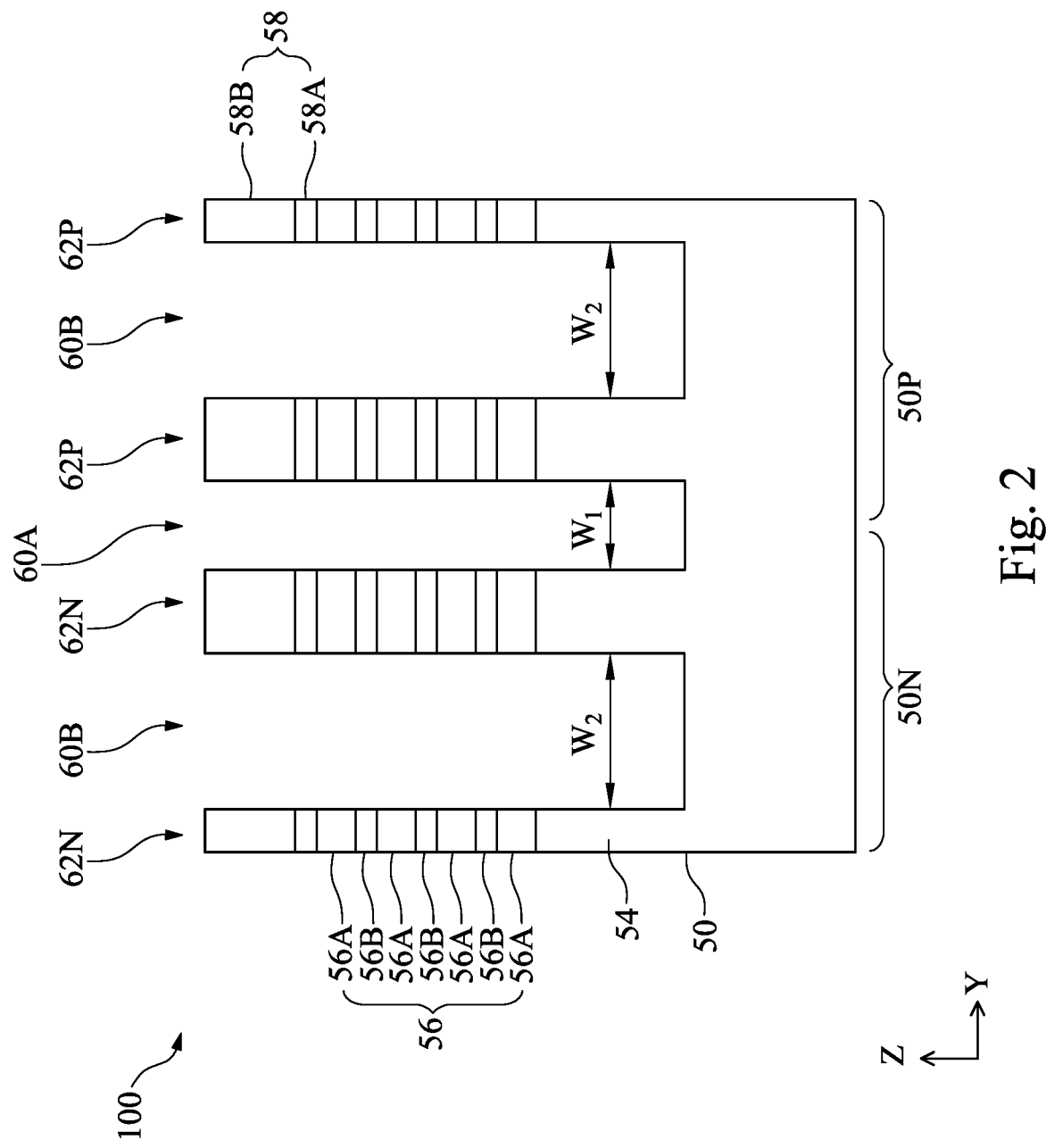

As shown in FIG. 2, trenches 60A and 60B (collectively 60) are etched in the substrate 50 and the multi-layer stack 52 to form fin structures 62 (including fin structures 62N in the n-type region 50N and fin structures 62P in the p-type region 50P). The fin structures 62 each include a semiconductor fin 54 and nanostructures 56. The semiconductor fins 54 are semiconductor strips patterned in the substrate 50. The nanostructures 56 include the remaining portions of the multi-layer stack 52 on the semiconductor fins 54. Specifically, the nanostructures 56 include alternating first nanostructures 56A and second nanostructures 56B. The first nanostructures 56A and the second nanostructures 56B are formed of remaining portions of the first semiconductor layers 52A and the second semiconductor layers 52B, respectively. In the illustrated embodiment, the second nanostructures 56B are each disposed between two of the first nanostructures 56A. The etching may be any acceptable etch process, such as a reactive ion etch (RIE), neutral beam etch (NBE), the like, or a combination thereof, and may be performed with masks 58 having a pattern of the fin structures 62. The etching may be anisotropic.

The masks 58 may be single layered masks, or may be multi-layered masks, such as multi-layered masks that each include a first mask layer 58A and a second mask layer 58B on the first mask layer 58A. The first mask layer 58A and the second mask layer 58B may each be formed from a dielectric material such as silicon oxide, silicon nitride, a combination thereof, or the like, and may be deposited or thermally grown according to acceptable techniques. The material of the first mask layer 58A may have a high etching selectivity from the etching of the material of the second mask layer 58B. For example, the first mask layer 58A may be formed of silicon oxide, and the second mask layer 58B may be formed of silicon nitride.

The fin structures 62 may be patterned by any suitable method. For example, the fin structures 62 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 62. In some embodiments, the masks 58 (or other layer) may remain on the fin structures 62.

The fin structures 62 can have widths in the range of about 5 nm to about 20 nm. The fin structures 62 in the n-type region 50N and the p-type region 50P are illustrated as having substantially equal widths for illustrative purposes. In some embodiments, the fin structures 62 in one region (e.g., the n-type region 50N) may be wider or narrower than the fin structures 62 in the other region (e.g., the p-type region 50P).

In some embodiments, the fin structures 62 are formed in adjacent pairs. Each pair of the fin structures 62 will be used to form forksheet FETs. One fin structure 62N of each pair will be used to form a n-type device, and the other fin structure 62P of each pair will be used to form a p-type device. The fin structures 62N, 62P of each pair are separated by corresponding first ones of the trenches 60A. A dielectric wall (discussed in greater detail below) will be formed in the trench 60A between the fin structures 62N, 62P of each pair, thus providing electrical isolation between the FETs of different types that will be formed in the fin structures 62N, 62P. The trenches 60A can have a first width W1 in the range of about 6 nm to about 30 nm. Adjacent pairs of the fin structures 62 are separated by corresponding second ones of the trenches 60B. The trenches 60B can have a second width W2 in the range of about 22 nm to about 46 nm. The width W2 is greater than the first width W1, so that adjacent pairs of fin structures 62 are spaced apart further than the fin structures 62N, 62P of each pair.

Figure 3:
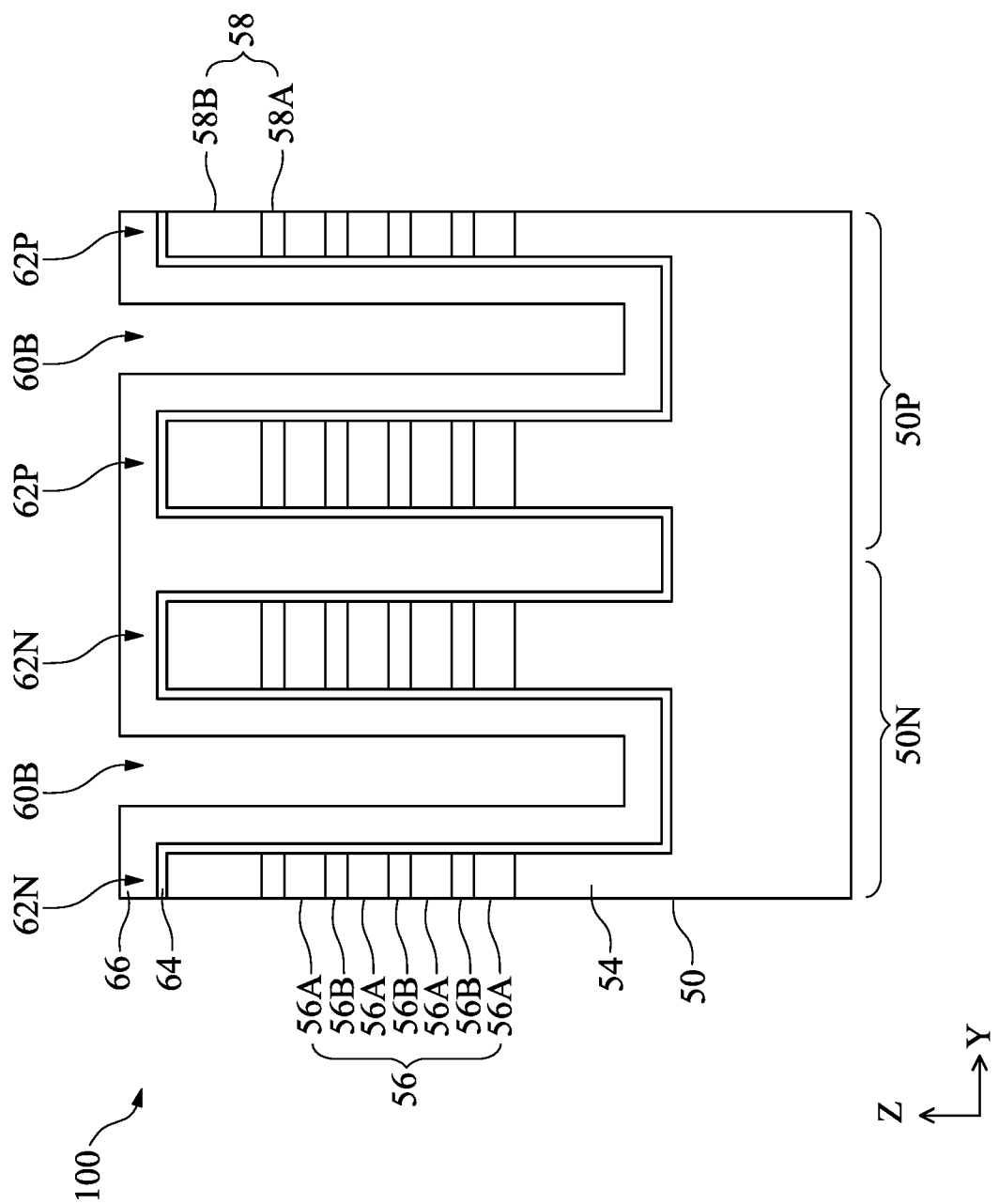

As shown in FIG. 3, a liner layer 64 is formed over the masks 58 (if present), the fin structures 62, and the substrate 50. The liner layer 64 may be formed of a dielectric material, which may be formed by thermal oxidation or a conformal deposition process. Acceptable dielectric materials include low-k dielectric materials (e.g., those having a k-value of less than about 7) such as silicon oxide, silicon nitride, silicon carbonitride, silicon oxycarbide, silicon oxycarbonitride, or the like; high-k dielectric materials (e.g., those having a k-value of greater than about 7) such as hafnium oxide, zirconium oxide, zirconium aluminum oxide, hafnium aluminum oxide, hafnium silicon oxide, aluminum oxide, or the like; combinations thereof; or the like. Acceptable deposition processes include atomic layer deposition (ALD), chemical vapor deposition (CVD), molecular-beam deposition (MBD), physical vapor deposition (PVD), or the like. In some embodiments, the liner layer 64 is formed of silicon oxide by thermal oxidation. The liner layer 64 can be formed to a thickness in the range of about 1 nm to about 10 nm.

A dielectric layer 66 is then formed on the liner layer 64. The dielectric layer 66 may be formed of a low-k dielectric material (such as one selected from the candidate dielectric materials of the liner layer 64), which may be deposited by a conformal deposition process (such as one selected from the candidate methods of forming the liner layer 64). The material of the dielectric layer 66 has a different k-value than the material of the liner layer 64, and has a high etching selectivity from the etching of the material of the liner layer 64. In some embodiments, the dielectric layer 66 is formed of silicon nitride by ALD or CVD.

Because the trenches 60A, 60B have different widths, they are filled with different amount of dielectric material. The liner layer 64 is formed along the sidewalls and the bottoms of the trenches 60A, 60B. Because the trenches 60A have a narrower width, they are completely filled (or overfilled) by the dielectric layer 66. However, because the trenches 60B have a larger width, they are not completely filled by the dielectric layer 66. In other words, after the dielectric layer 66 is deposited, the trenches 60A are filled (or overfilled) but some portions of the trenches 60B remain unfilled.

Figure 4:
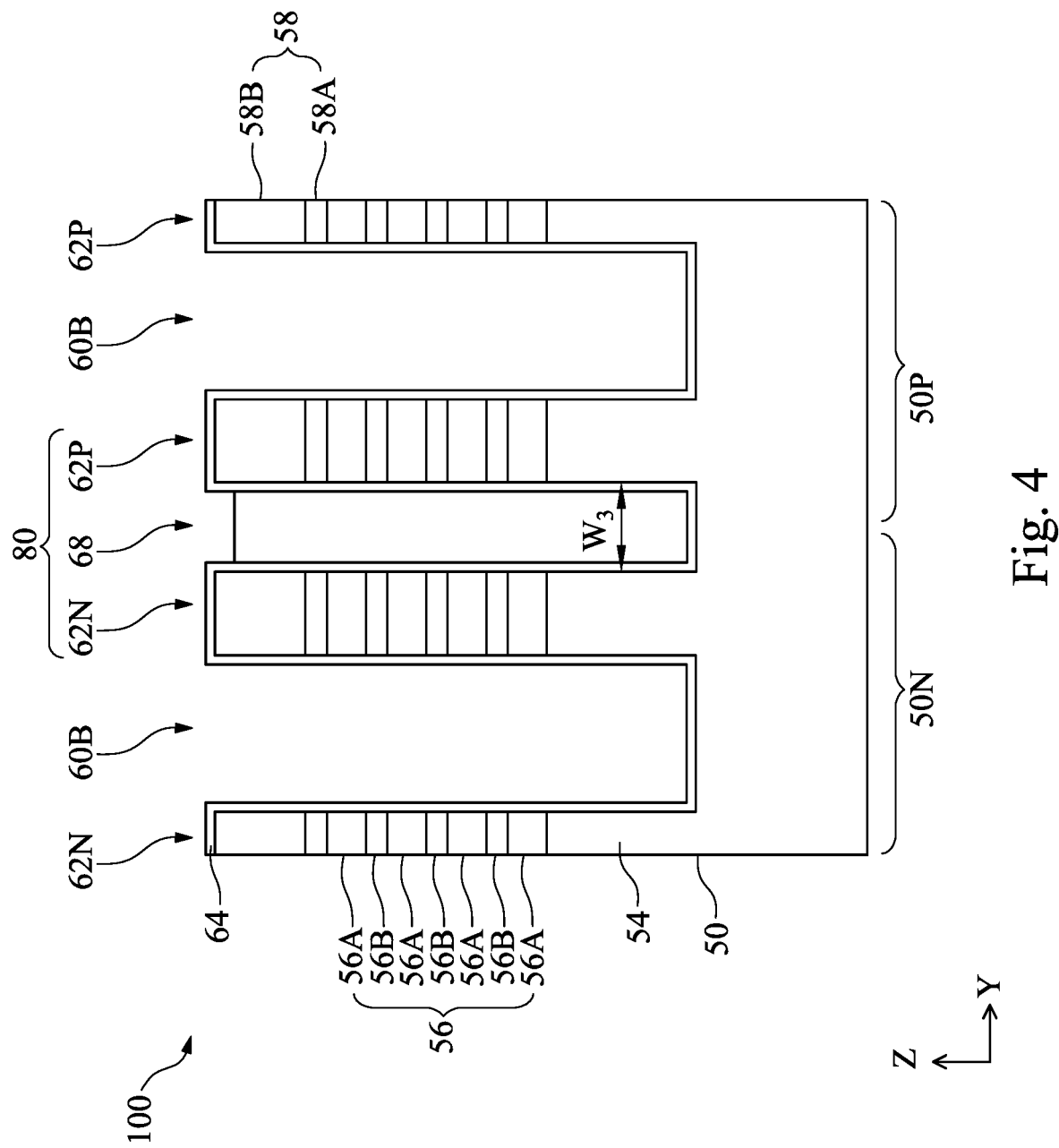

As shown in FIG. 4, the dielectric layer 66 is etched back to remove some portions of the dielectric layer 66. Specifically, the portions of the dielectric layer 66 in the trenches 60B and over the masks 58 (if present) or the fin structures 62 are removed by the etch back, thus reforming the trenches 60B. The dielectric layer 66 is etched back using acceptable etching techniques, such as with an etching process that is selective to the dielectric layer 66 (e.g., etches the material(s) of the dielectric layer 66 at a faster rate than the material(s) of the liner layer 64). After the etch back is complete, the remaining portions of the dielectric layer 66 are in the trenches 60A. The remaining portions of the dielectric layer 66 form dielectric walls 68 separating the fin structures 62N, 62P of each pair of the fin structures 62. The dielectric walls 68 may partially or fully fill the trenches 60A. The dielectric walls 68 can have a width W3 in the range of about 6 nm to about 30 nm. After the dielectric layers 66 are formed, forksheet structures 80 extend from the substrate 50. The forksheet structures 80 each include a dielectric wall 68 and a pair of fin structures 62, with the dielectric wall 68 disposed between the fin structures 62.

As noted above, although one n-type region 50N and one p-type region 50P are illustrated, the substrate 50 can include any desired quantity of such regions. In some embodiments, each forksheet structure 80 is disposed at the boundaries of a n-type region 50N and a p-type region 50P. Further, the fin structures 62N, 62P of each forksheet structure 80 alternate. In other words, each n-type region 50N includes a first fin structure 62N from a first forksheet structure 80, and includes a second fin structure 62N from a second forksheet structure 80.

Figure 5:
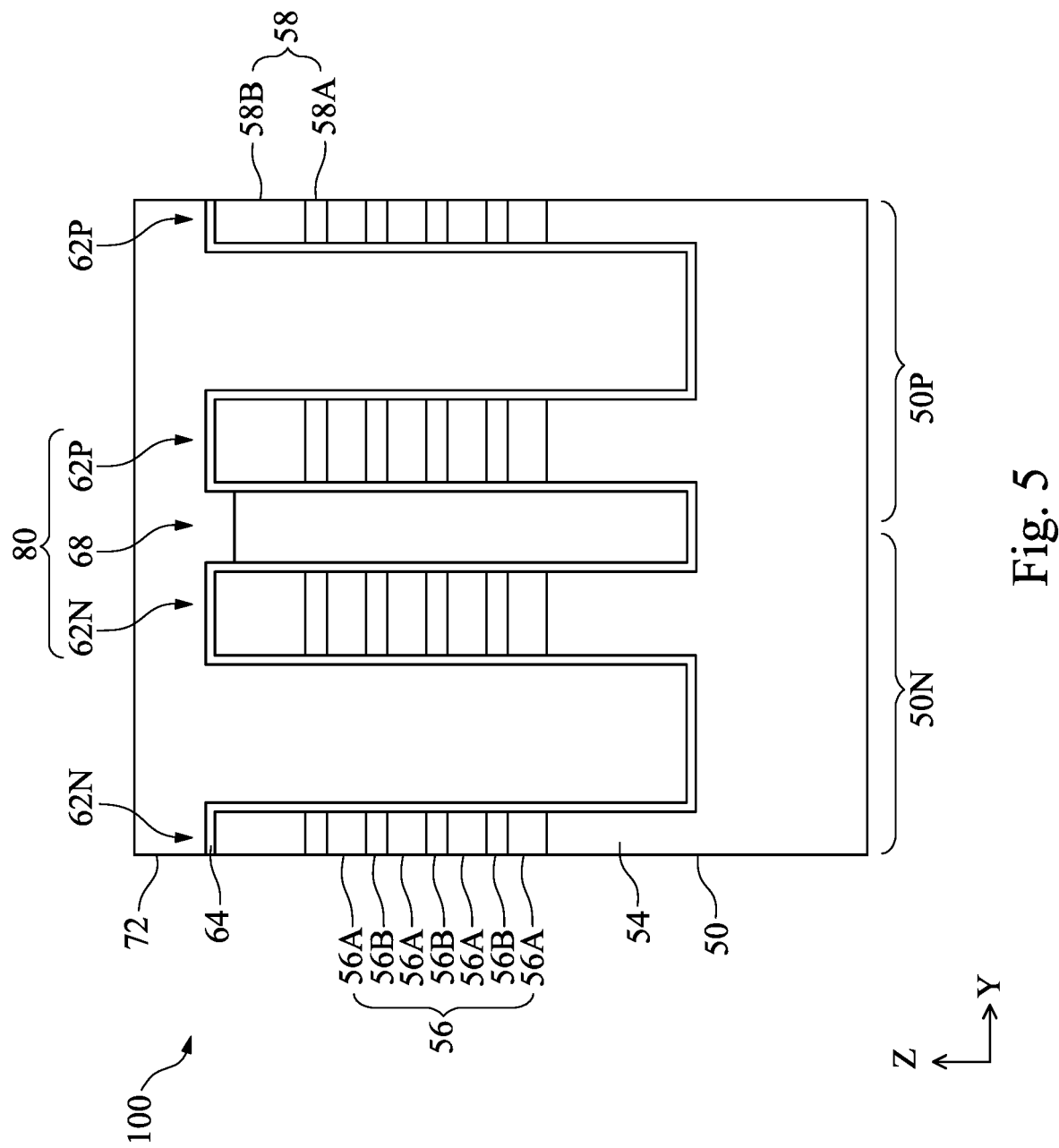

As shown in FIG. 5, an insulation material 72 is deposited over the dielectric walls 68 and the liner layer 64. The insulation material 72 fills the trenches 60B and may also be formed over the masks 58 (if present) or the fin structures 62. When the dielectric walls 68 partially fill the trenches 60A, the insulation material 72 can also be formed in the remaining portions of the trenches 60A. The insulation material 72 may be an oxide such as silicon oxide, a nitride such as silicon nitride, the like, or a combination thereof, and may be formed by high-density plasma CVD (HDP-CVD), flowable CVD (FCVD), the like, or a combination thereof. Other insulation materials formed by any acceptable process may be used. An anneal process may be performed once the insulation material 72 is formed. Although the insulation material 72 is illustrated as a single layer, some embodiments may utilize multiple layers. A removal process is then applied to the insulation material 72 to remove excess material of the liner layer 64 and the insulation material 72 over the masks 58 (if present) or the fin structures 62. In some embodiments, a planarization process such as a chemical mechanical polish (CMP), an etch-back process, combinations thereof, or the like may be utilized. The planarization process exposes the masks 58 or the nanostructures 56 such that top surfaces of the masks 58 or the nanostructures 56, the remaining portions of the liner layers 64, and the insulation material 72 are coplanar (within process variations) after the planarization process is complete. In the illustrated embodiment, the masks 58 remain after the planarization process. In another embodiment, the masks 58 may also be removed by the planarization process.

Figure 6:
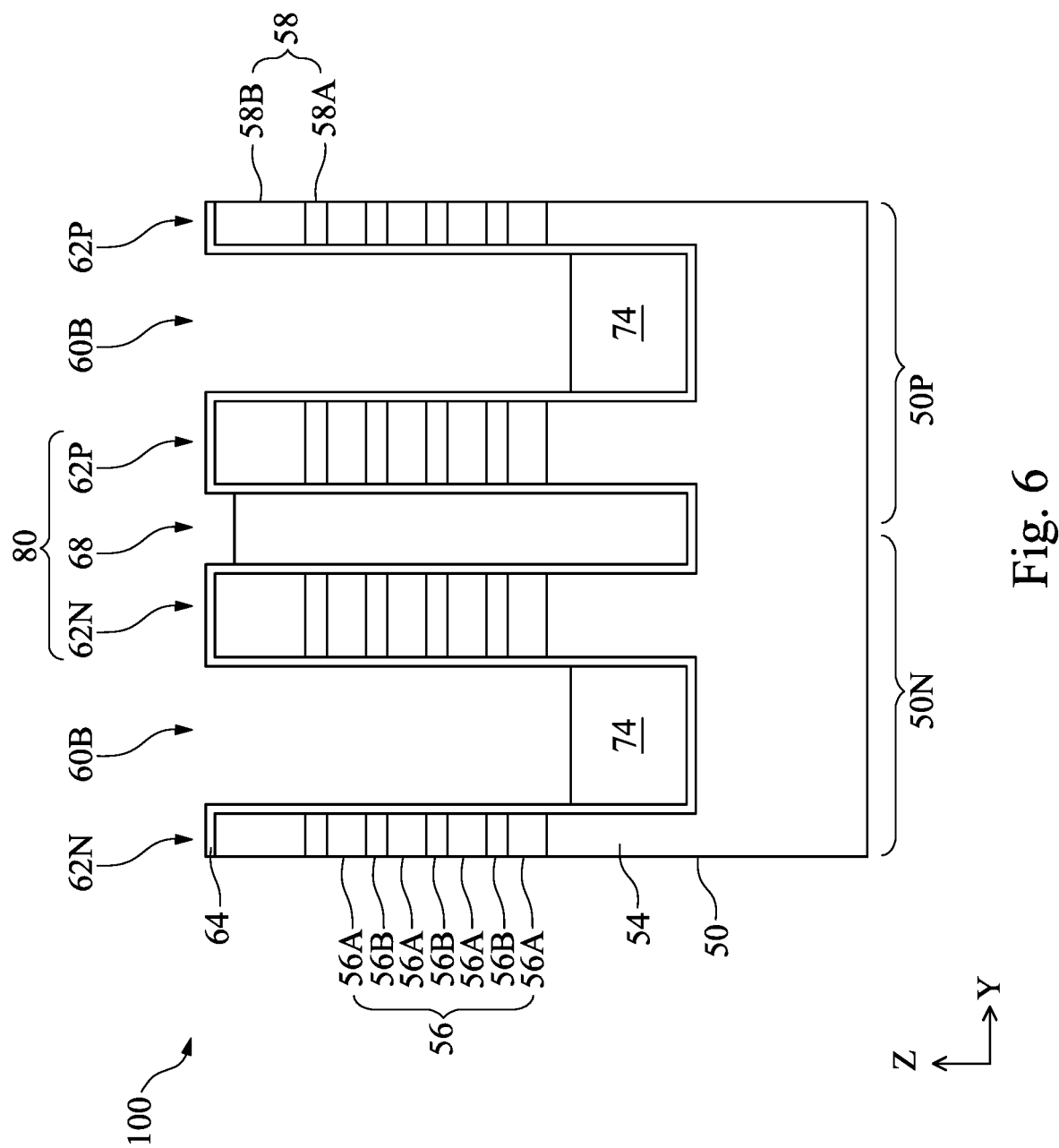

As shown in FIG. 6, the insulation material 72 is recessed to form STI regions 74, thus reforming portions of the trenches 60B. The insulation material 72 is recessed such that at least a portion of the nanostructures 56 protrude from the STI regions 74. The insulation material 72 may be recessed using an acceptable etching process, such as one that is selective to the insulation material 72 (e.g., selectively etches the material(s) of the insulation material 72 at a faster rate than the liner layer 64).

After the STI regions 74 are formed, the forksheet structures 80 extend from between neighboring STI regions 74. It should be appreciated that the process described above is just one example of how the forksheet structures 80 may be formed. Other acceptable processes may also be used to form the forksheet structures 80 and the STI regions 74. The forksheet structures 80 may be processed in a similar manner as semiconductor fins would be processed in a process for forming FinFETs. Processing a forksheet structure 80 in such a manner allows both n-type devices and p-type devices to be integrated in a same forksheet structure 80.

Figure 7:
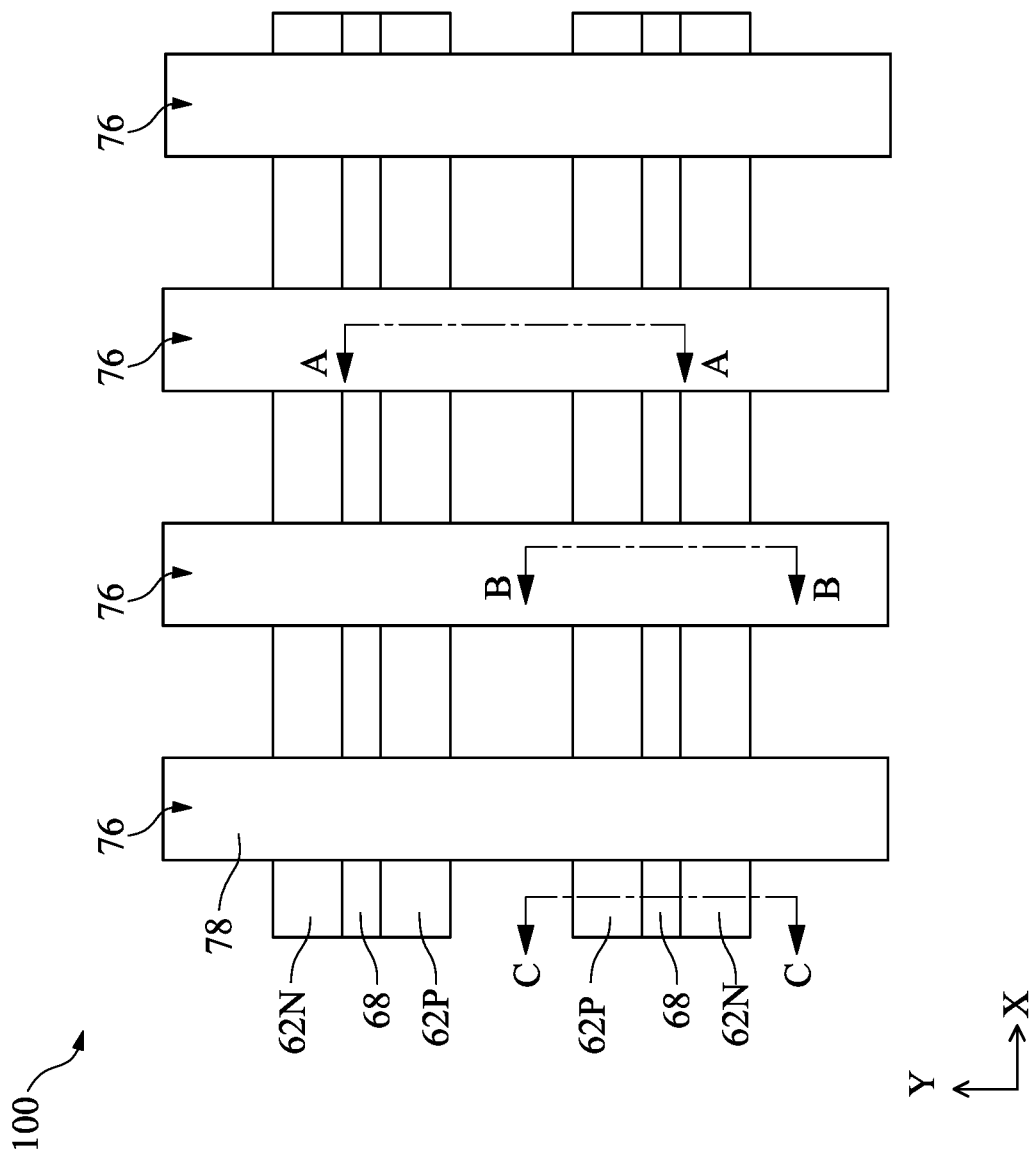
FIG. 7 is a top view of one of various stages of manufacturing the semiconductor device structure, in accordance with some embodiments.

FIG. 7 is a top view of one of various stages of manufacturing the semiconductor device structure 100, in accordance with some embodiments. As shown in FIG. 7, one or more sacrificial gate structures 76 are formed over the semiconductor device structure 100. The sacrificial gate structures 76 are formed over portions of the fin structures 62. Each sacrificial gate structure 76 may include a sacrificial gate dielectric layer (not shown), a sacrificial gate electrode layer 78, and a mask layer (not shown). The sacrificial gate dielectric layer, the sacrificial gate electrode layer 78, and the mask layer may be formed by sequentially depositing blanket layers of the sacrificial gate dielectric layer, the sacrificial gate electrode layer 78, and the mask layer, and then patterning those layers into the sacrificial gate structures 76. Gate spacers 81 (FIG. 8C) are then formed on sidewalls of the sacrificial gate structures 76. The gate spacers 81 may be formed by conformally depositing one or more layers for the gate spacers 81 and anisotropically etching the one or more layers, for example.

The sacrificial gate dielectric layer may include one or more layers of dielectric material, such as a silicon oxide-based material. The sacrificial gate electrode layer 78 may include silicon such as polycrystalline silicon or amorphous silicon. The mask layer may include more than one layer, such as an oxide layer and a nitride layer. The gate spacer 81 may be made of a dielectric material such as silicon oxide, silicon nitride, silicon carbide, silicon oxynitride, SiCN, silicon oxycarbide, SiOCN, and/or combinations thereof.

Figure 8C:
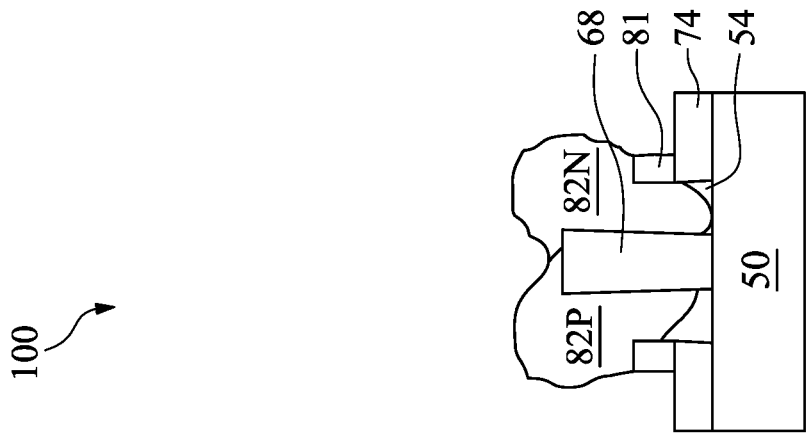
Figure 8B:
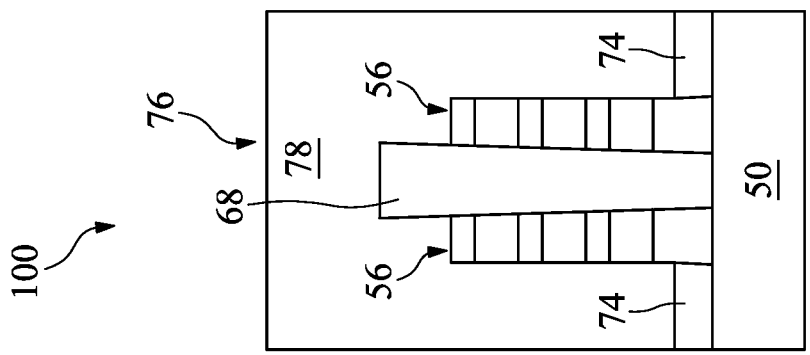
Figure 8A:
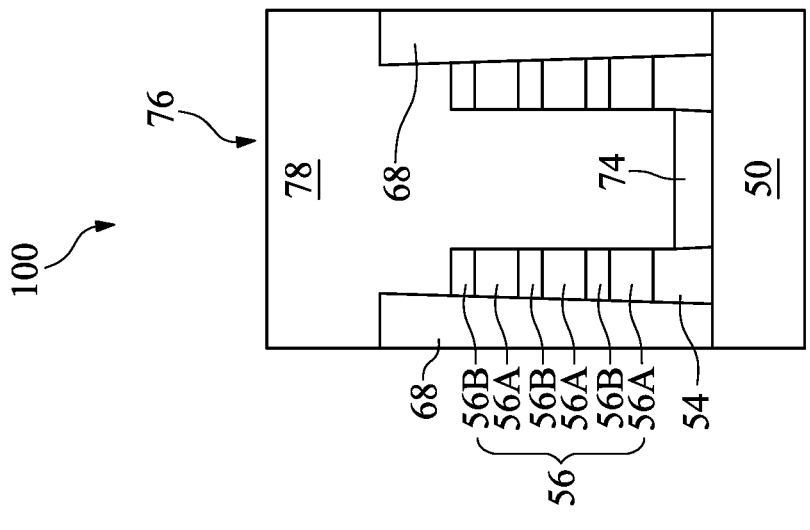

FIGS. 8A-13A are cross-sectional side views of various stages of manufacturing the semiconductor device structure 100 taken along line A-A of FIG. 7, in accordance with some embodiments. FIGS. 8B-13B are cross-sectional side views of various stages of manufacturing the semiconductor device structure 100 taken along line B-B of FIG. 7, in accordance with some embodiments. FIGS. 8C-13C are cross-sectional side views of various stages of manufacturing the semiconductor device structure 100 taken along line C-C of FIG. 7, in accordance with some embodiments. FIGS. 8A and 8B illustrate cross-sections in the channel regions under the sacrificial gate structures 76, and FIG. 8C illustrates a cross-section in the source/drain region.

As shown in FIGS. 8A, 8B and 8C, the portions of the nanostructures 56 not covered by the sacrificial gate structures 76 are recessed to expose portions of the semiconductor fins 54. The recessing of the portions of the nanostructures 56 can be done by an etch process, either isotropic or anisotropic etch process, and the etch process may be selective with respect to one or more crystalline planes of the substrate 101. The etch process may be a dry etch, such as a RIE, NBE, or the like, or a wet etch, such as using tetramethyalammonium hydroxide (TMAH), ammonium hydroxide (NH$_4$OH), or any suitable etchant. In some embodiments, the recessing of the portions of the nanostructures 56 also recesses an exposed portion of the dielectric wall 68, as shown in FIG. 8C. As a result, the portions of the dielectric wall 68 located under the sacrificial gate structures 76 have a first height, and the portions of the dielectric wall 68 not covered by the sacrificial gate structures 76 have a second height substantially less than the first height.

While not shown in FIGS. 8A, 8B, and 8C, after recessing the portions of the nanostructures 56 not covered by the sacrificial gate structures 76, the edge portions of each first nanostructures 56A are removed horizontally along the X direction. The removal of the edge portions of the first nanostructures 56A forms cavities. In some embodiments, the edge portions of the first nanostructures 56A are removed by a selective wet etch process. In cases where the first nanostructures 56A are made of SiGe and the second nanostructures 56B are made of silicon, the first nanostructures 56A can be selectively etched using a wet etchant such as, but not limited to, ammonium hydroxide (NH$_4$OH), tetramethylammonium hydroxide (TMAH), ethylenediamine pyrocatechol (EDP), or potassium hydroxide (KOH) solutions.

After removing the edge portions of each first nanostructures 56A, a dielectric layer is deposited in the cavities to form dielectric spacers (not shown). The dielectric spacers may be made of a low-k dielectric material, such as SiON, SiCN, SiOC, SiOCN, or SiN. The dielectric spacers may be formed by first forming a conformal dielectric layer using a conformal deposition process, such as ALD, followed by an anisotropic etching to remove portions of the conformal dielectric layer other than the dielectric spacers. The dielectric spacers are protected by the second nanostructures 56B during the anisotropic etching process. The remaining first nanostructures 56A are capped between the dielectric spacers along the X direction.

As shown in FIG. 8C, source/drain (S/D) regions 82P, 82N are formed from the exposed portion of the semiconductor fins 54. The S/D regions 82P, 82N may grow both vertically and horizontally to form facets, which may correspond to crystalline planes of the material used for the semiconductor fins 54. In this disclosure, a source region and a drain region are interchangeably used, and the structures thereof are substantially the same. Furthermore, source/drain region(s) may refer to a source or a drain, individually or collectively dependent upon the context. The S/D region 82N may be made of one or more layers of Si, SiP, and SiAs for NFETs, and the S/D region 82P may be made of one or more layers of SiGe, SiGeB, and GeSn for PFETs. For PFETs, p-type dopants, such as boron (B), may also be included in the S/D regions 82P. The S/D regions 82P, 82N may be formed by an epitaxial growth method using CVD, ALD or MBE. One or more masks (not shown) may be used to form the S/D regions 82P, 82N at different times. In some embodiments, the S/D regions 82P, 82N are in contact with each other as a result of the shortened dielectric wall 68 having the second height, as shown in FIG. 8C. The S/D regions 82P, 82N may be in contact with each other at a location over the dielectric wall 68.

Figure 9C:
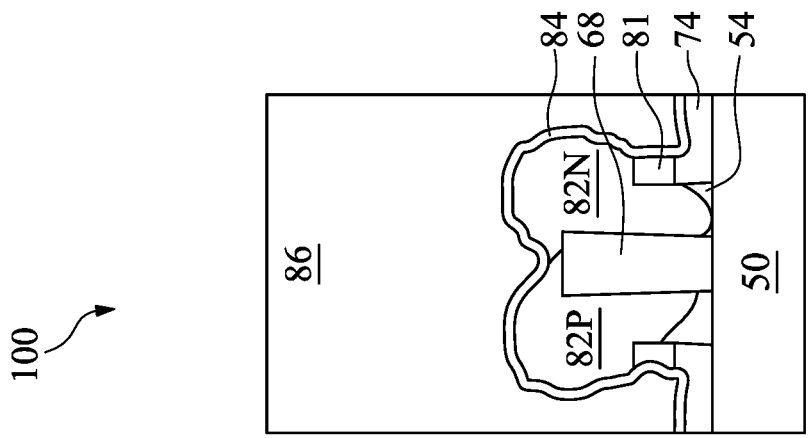
Figure 9B:
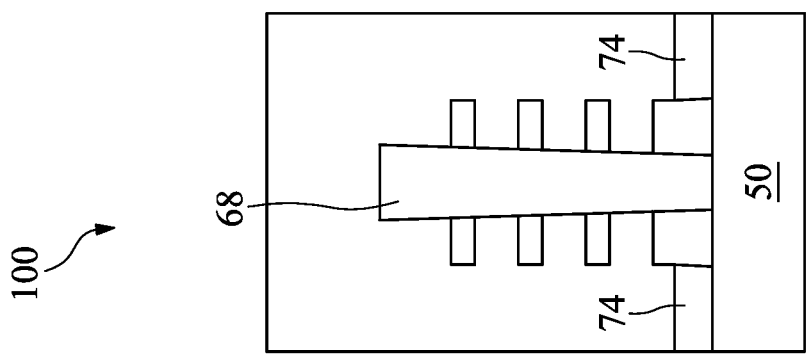
Figure 9A:
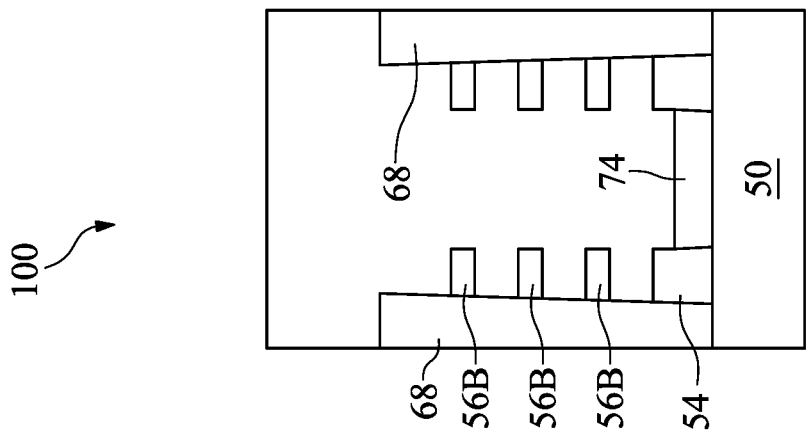

As shown in FIGS. 9A, 9B, and 9C, a contact etch stop layer (CESL) 84 is conformally formed on the exposed surfaces of the semiconductor device structure 100. The CESL 84 covers the sidewalls of the sacrificial gate structures 76, the STI regions 74, and the S/D regions 82P, 82N. The CESL 84 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, an interlayer dielectric (ILD) layer 86 is formed on the CESL 84 over the semiconductor device structure 100. The materials for the ILD layer 86 may include compounds including Si, O, C, and/or H, such as silicon oxide, SiCOH, or SiOC. Organic materials, such as polymers, may also be used for the ILD layer 86. The ILD layer 86 may be deposited by a PECVD process or other suitable deposition technique. In some embodiments, after formation of the ILD layer 86, the semiconductor device structure 100 may be subject to a thermal process to anneal the ILD layer 86.

After the ILD layer 164 is formed, a planarization operation, such as CMP, is performed on the semiconductor device structure 100 until the sacrificial gate electrode layer 78 (FIG. 8A) is exposed. Next, the sacrificial gate structures 76 and the first nanostructures 56A are removed. The removal of the sacrificial gate structures 76 and the first nanostructures 56A forms an opening between gate spacers 81 and between second nanostructures 56B. The ILD layer 86 protects the S/D regions 82P, 82N during the removal processes. The sacrificial gate structures 76 can be removed using plasma dry etching and/or wet etching. The sacrificial gate electrode layer 78 may be first removed by any suitable process, such as dry etch, wet etch, or a combination thereof, followed by the removal of the sacrificial gate dielectric layer, which may also be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 78 but not the gate spacers 81, the ILD layer 86, and the CESL 84.

The first nanostructures 56A may be removed using a selective wet etching process. In one embodiment, the first nanostructures 56A can be removed using a wet etchant such as, but not limited to, hydrofluoric (HF), nitric acid ($HNO_3$), hydrochloric acid (HCl), phosphoric acid ($H_3PO_4$), a dry etchant such as fluorine-based (e.g., $F_2$) or chlorine-based gas (e.g., $Cl_2$), or any suitable isotropic etchants.

Figure 10C:
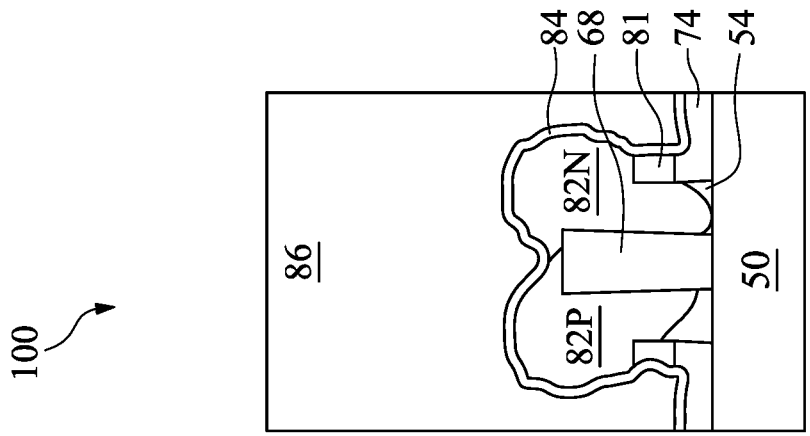
Figure 10B:
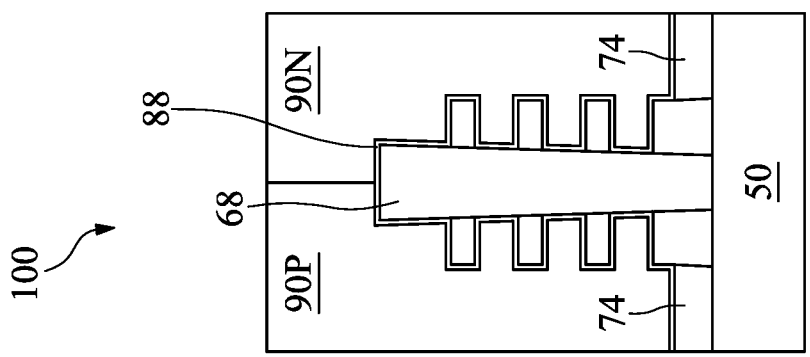
Figure 10A:
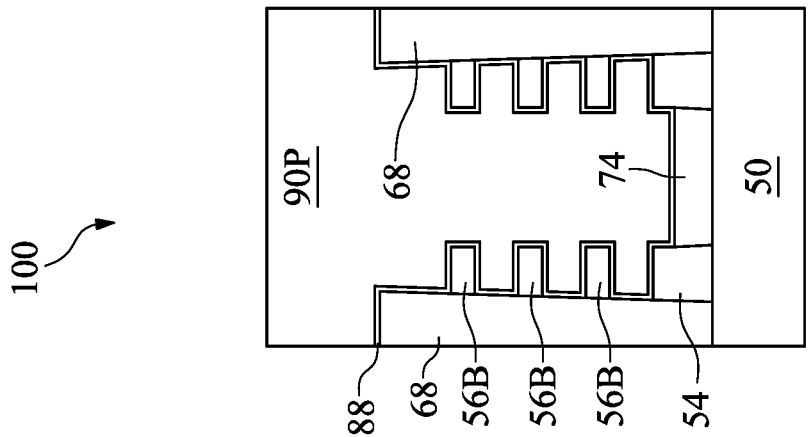

As shown in FIGS. 10A, 10B, and 10C, after the formation of the nanostructure channels (i.e., the exposed portions of the second nanostructures 56B), a gate dielectric layer 88 is formed to surround the exposed portions of the second nanostructures 56B, and gate electrode layers 90P, 90N is formed on the gate dielectric layer 88.

The gate dielectric layer 88 and the gate electrode layer 90P or 90N may be collectively referred to as a gate structure. In some embodiments, an interfacial layer (IL) (not shown) is formed between the gate dielectric layer 88 and the exposed surfaces of the second nanostructures 56B. In some embodiments, the gate dielectric layer 88 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 88 may be formed by CVD, ALD or any suitable deposition technique. The gate electrode layer 90P may include one or more layers of conductive material, such as TiN, TaN, Ru, Mo, Al, WN, TiSiN, TiTaN, TiAlN, WCN, $ZrSi_2$, $MoSi_2$, $TaSi_2$, $NiSi_2$, or other suitable materials, or any combination thereof. The gate electrode layer 90N may include one or more layers of conductive material, such as Ti, Ag, TaAl, TaAlC, TiAlN, TaC, TaCN, TaSiN, TiAl, TiTaN, Mn, Zr, other suitable N-type work function materials, or any combination thereof. The gate electrode layers 90N, 90P may be formed by CVD, ALD, electro-plating, or other suitable deposition technique. The gate electrode layers 90N, 90P may be also deposited over the upper surface of the ILD layer 86. The portions of the gate dielectric layer 88 and the gate electrode layers 90N, 90P formed over the ILD layer 86 are then removed by using, for example, CMP, until the top surface of the ILD layer 86 is exposed.

Figure 11C:
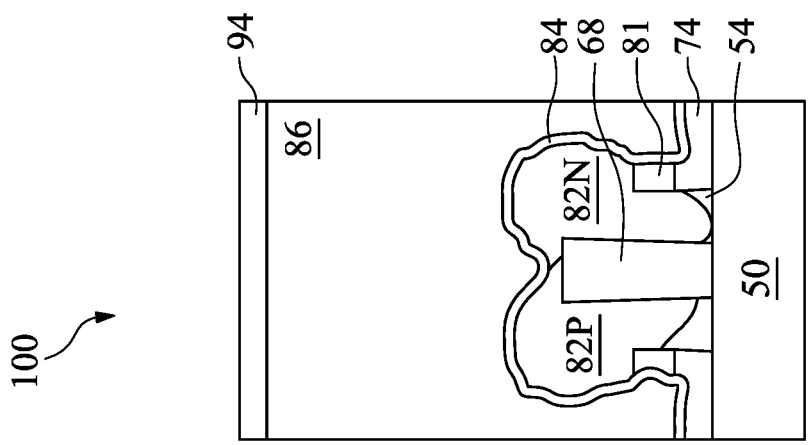
Figure 11B:
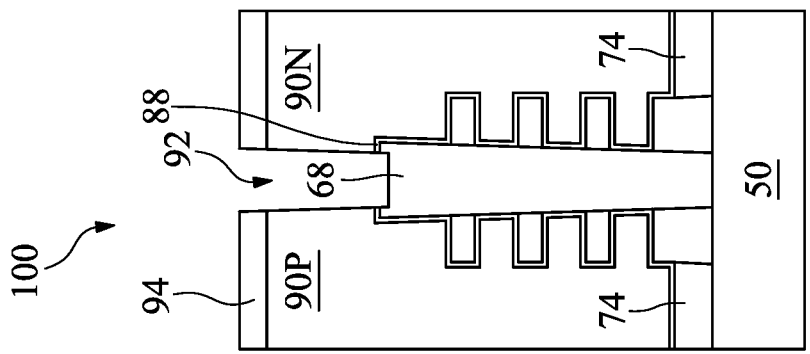
Figure 11A:
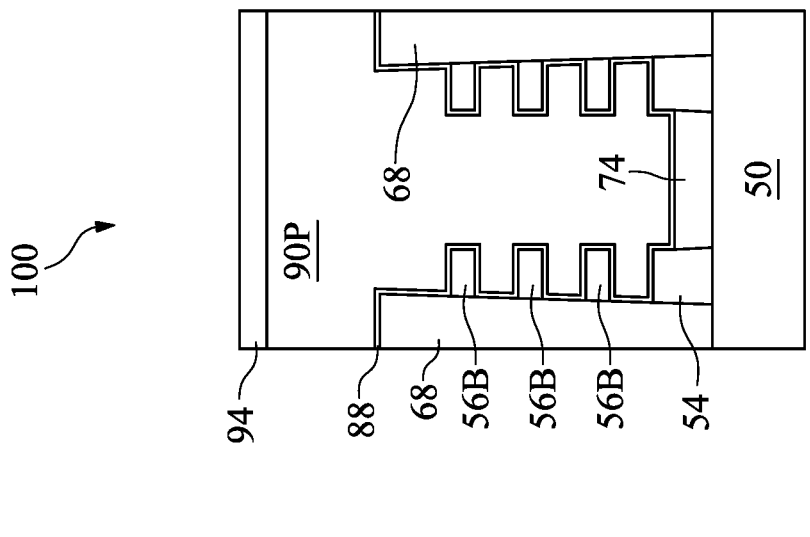

Next, as shown in FIGS. 11A, 11B, and 11C, an opening 92 is formed in the gate electrode layers 90P, 90N to expose a portion of the dielectric wall 68. A hard mask layer 94 is formed on the gate electrode layers 90N, 90P and the ILD layer 86. The hard mask layer 94 is then patterned, and the pattern of the hard mask layer 94 is transferred to the gate electrode layers 90P, 90N. The opening 92 may be formed by one or more etch processes. For example, a first etch process is performed to remove portions of the gate electrode layers 90P, 90N and to expose a portion of the gate dielectric layer 88, and a second etch process is performed to remove the exposed portion of the gate dielectric layer 88. In some embodiments, a single etch process is performed to remove the portions of the gate electrode layers 90P, 90N and the gate dielectric layer 88. The one or more etch processes may also remove a portion of the dielectric wall 68, as shown in FIG. 11B. In some embodiments, the dielectric wall 68 is recessed by about 5 nm or greater.

Figure 12C:
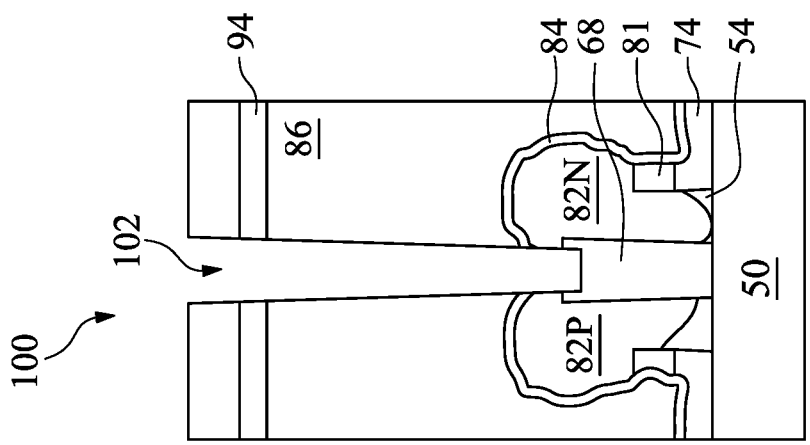
Figure 12B:
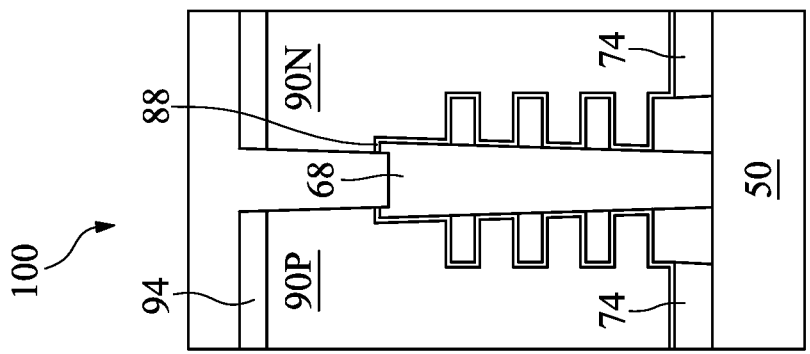
Figure 12A:
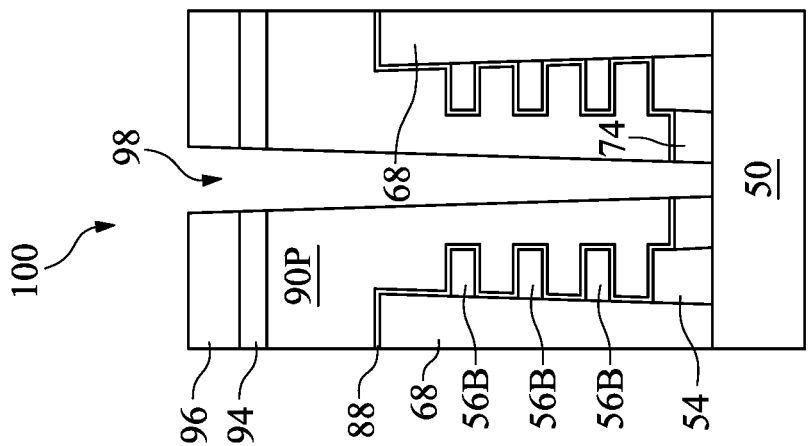

Next, as shown in FIGS. 12A, 12B, and 12C, a dielectric material 96 is formed in the opening 92 to fill the opening 92. The dielectric material 96 may be also formed on the hard mask layer 94. The dielectric material 96 may include a single layer or multiple layers. For example, the dielectric material 96 may include a single SiN layer or a single oxide layer. The dielectric material 96 may include a SiN layer and an oxide layer. The dielectric material 96 may be formed by any suitable process, such as CVD, ALD, or FCVD. The dielectric material 96 electrically separates the gate electrode layers 90P, 90N. The process to form the dielectric material 96 to electrically separate gate electrode layers 90N, 90P may be referred to as a cut metal gate (CMG) process.

After forming the dielectric material 96, openings 98 and 102 are formed, as shown in FIGS. 12A and 12C. In some embodiments, the opening 98 is formed by removing a portion of the gate electrode layer 90P, a portion of the gate dielectric layer 88, and a portion of the STI region 74, and a portion of the substrate 50 may be exposed in the opening 98. In some embodiments, the opening 102 is formed by removing a portion of the ILD layer 86, a portion of the CESL 84, a portion of the S/D region 82P, a portion of the S/D region 82N, and a portion of the dielectric wall 68. In some embodiments, the dielectric wall 68 is recessed by about 5 nm or greater in the opening 102. In some embodiments, the openings 98, 102 are formed simultaneously. For example, a plasma dry etch process using chlorine-based etchant may be used to form both openings 98, 102. The openings 98, 102 may be also formed in the dielectric material 96, as shown in FIGS. 12A and 12C. The opening 98 is to separate the gate electrode layer 90P into two portions (another CMG process), while the opening 102 is to separate the S/D regions 82P, 82N. A patterned photoresist (not shown) may be formed over the dielectric material 96 to protect the portions of the dielectric material 96.

Figure 13A:
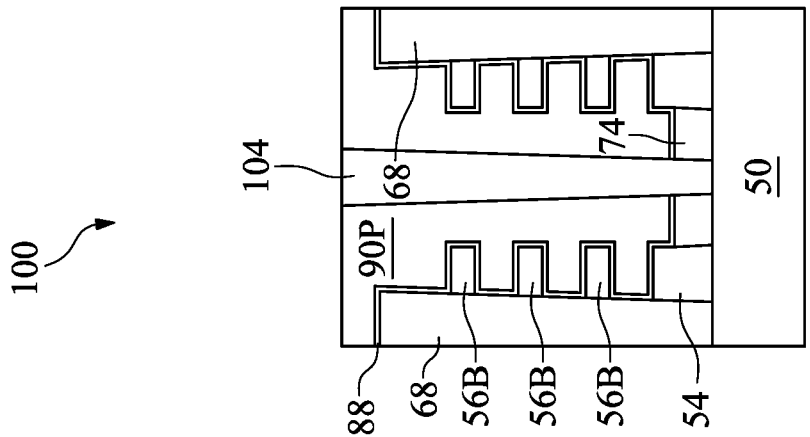
Figure 13B:
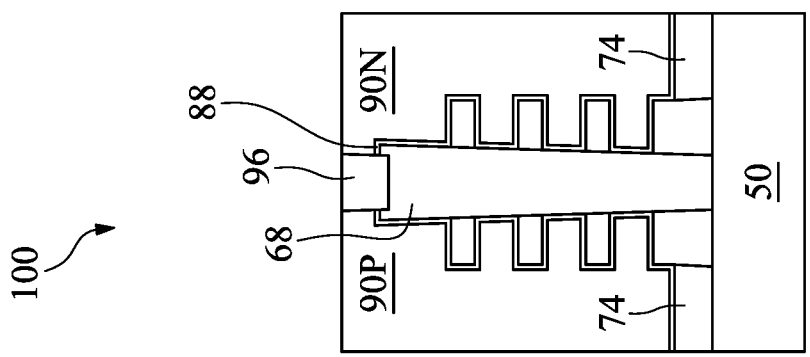
Figure 13C:
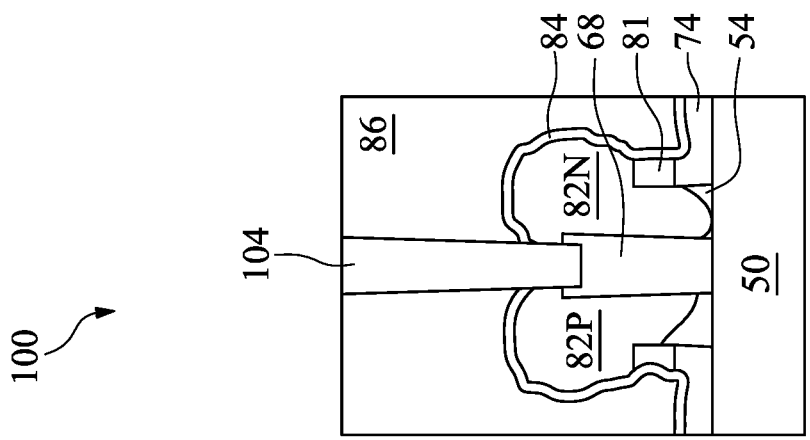

Next, as shown in FIGS. 13A, 13B, and 13C, a dielectric material 104 is formed in the openings 98, 102 to fill the openings 98, 102. The dielectric material 104 may include the same material as the dielectric material 96 and may be formed by the same process as the dielectric material 96. In some embodiments, the dielectric material 104 and the ILD layer 86 include different materials. The term "different materials" described herein also covers same material with different compositions. As shown in FIG. 13C, the dielectric material 104 may be disposed in the recess formed in the dielectric wall 68. After filling the openings 98, 102 with the dielectric material 104, a planarization process, such as a CMP process, may be formed to expose the gate electrode layers 90N, 90P and the ILD layer 86.

FIGS. 14-16 are cross-sectional side views of various stages of manufacturing the semiconductor device structure 100 taken along line C-C of FIG. 7, in accordance with some embodiments. As shown in FIG. 14, an etch stop layer 106 is formed on the ILD layer 86 and the dielectric material 104 over the S/D regions 82P, 82N, another ILD layer 108 is formed on the etch stop layer 106, and a patterned mask layer 110 is formed on the ILD layer 108. The patterned mask layer 110 may be aligned with the dielectric material 104, as shown in FIG. 14. Next, as shown in FIG. 15, exposed portions of the ILD layer 108 not covered by the patterned mask layer 110 are removed. Portions of the etch stop layer 106, portions of the ILD layer 86, and portions of the CESL 84 located under the exposed portions of the ILD layer 108 are also removed to expose the S/D regions 82P, 82N. The removal of the materials may be performed by any suitable process, such as one or more etch processes. In some embodiments, portions of the S/D regions 82P, 82N are also removed by the one or more etch processes.

Next, conductive contacts 112 are formed over the exposed S/D regions 82P, 82N. The conductive contacts 112 include an electrically conductive material, such as copper, a copper alloy, silver, gold, tungsten, cobalt, aluminum, nickel, or the like. In some embodiments, a liner (not shown) and/or a barrier (not shown) layer may be formed first, and the electrically conductive material is formed on the liner and/or the barrier. A silicide layer 114 may be formed between each S/D region 82P, 82N and the corresponding conductive contact 112. The conductive contact 112 may be electrically connected to the corresponding S/D region 82P, 82N via the silicide layer 114. A planarization process, such as a CMP, may be performed to remove the patterned mask layer 110.

As shown in FIG. 16, the conductive contact 112 includes a top surface 112t and a bottom surface 112b opposite the top surface 112t. The ILD layer 108 includes a top surface 108t substantially coplanar with the top surface 112t of the conductive contact 112. The ILD layer 108 extends from the top surface 108t to a level between the top surface 112t and the bottom surface 112b. The etch stop layer 106 is located at a level between the top surface 112t and the bottom surface 112b. The dielectric material 104 extends from a level between the top surface 112t and the bottom surface 112b to a level below the bottom surface 112b, as shown in FIG. 16.

The process described in FIGS. 11A to 13C shows that the dielectric material 104 for separating the S/D region 82P and the S/D region 82N is formed with the dielectric material 104 for separating the gate electrode layer 90P into two portions. In other words, the S/D regions 82N, 82P are separated during the CMG process to separate the gate electrode layer 90P into two portions. In some embodiments, the S/D regions 82N, 82P are separated during the CMG process to separate the gate electrode layers 90N, 90P. In some embodiments, the S/D regions 82N, 82P are separated at a time different from any of the CMG processes. The S/D regions 82N, 82P may be separated at any suitable time.

FIGS. 17A-19A are cross-sectional side views of various stages of manufacturing the semiconductor device structure 100 taken along line A-A of FIG. 7, in accordance with alternative embodiments. FIGS. 17B-19B are cross-sectional side views of various stages of manufacturing the semiconductor device structure 100 taken along line B-B of FIG. 7, in accordance with alternative embodiments. FIGS. 17C-19C are cross-sectional side views of various stages of manufacturing the semiconductor device structure 100 taken along line C-C of FIG. 7, in accordance with alternative embodiments.

Figure 17C:
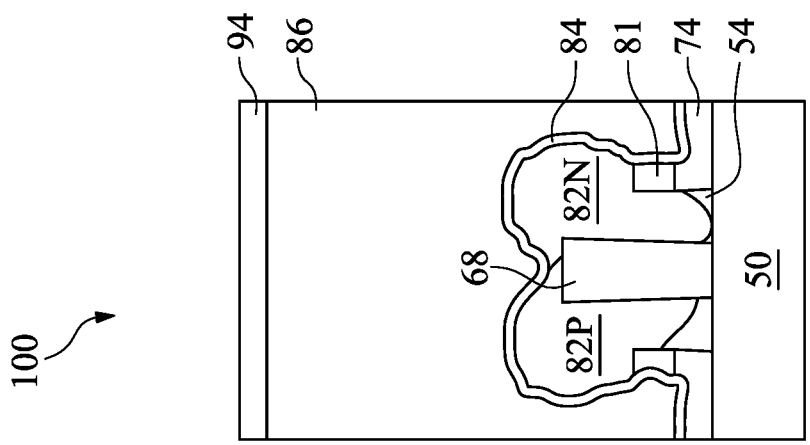
Figure 17B:
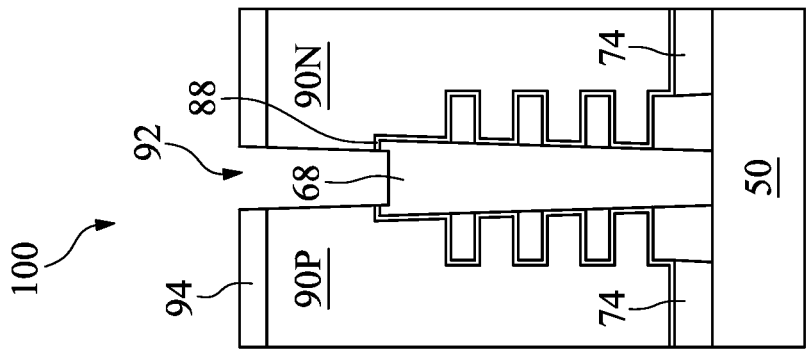
Figure 17A:
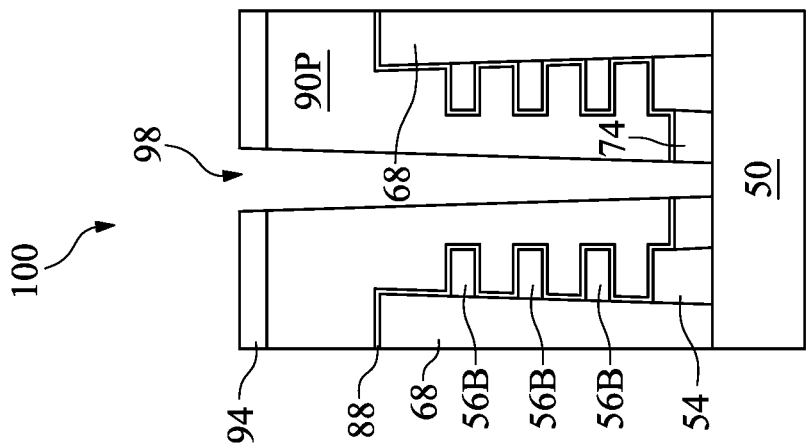

As shown in FIGS. 17A, 17B, and 17C, after forming the gate electrode layers 90P, 90N as described in FIGS. 10A, 10B, and 10C, the hard mask layer 94 is formed, and the openings 92, 98 are formed simultaneously. The opening 92 is substantially shallower than the opening 98, and the dielectric wall 68 located between the gate electrode layer 90P, 90N may be substantially unaffected by the etchant used to form the openings 92, 98.

Figure 18C:
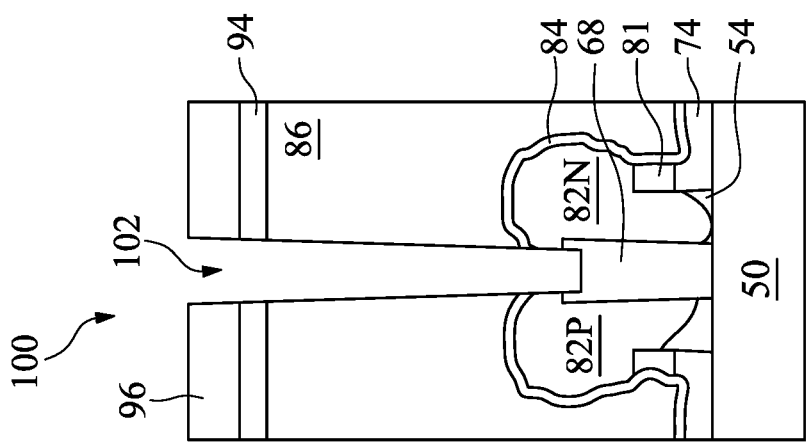
Figure 18B:
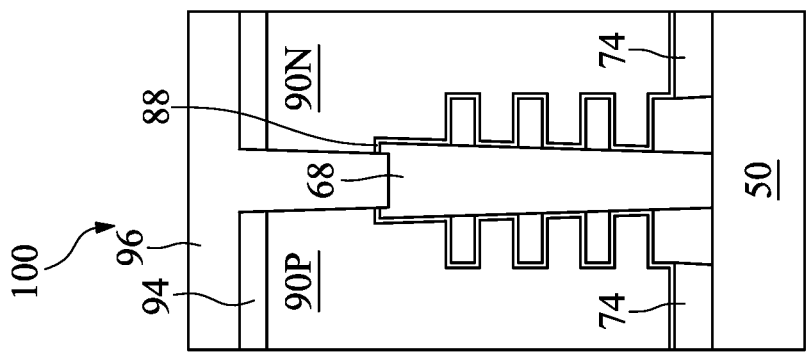
Figure 18A:
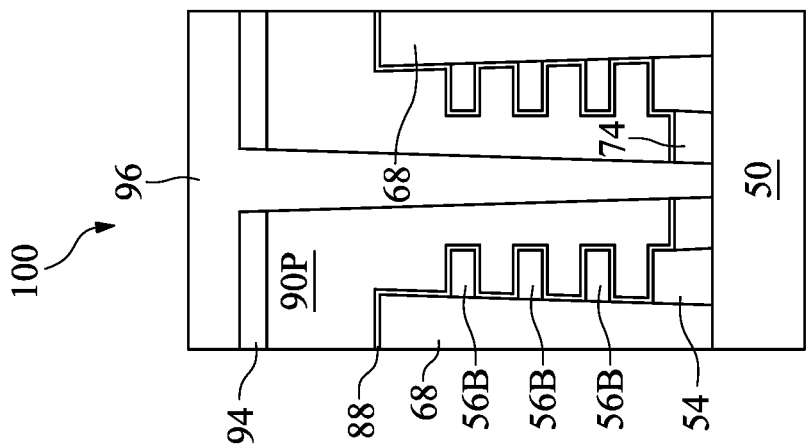
Figure 19C:
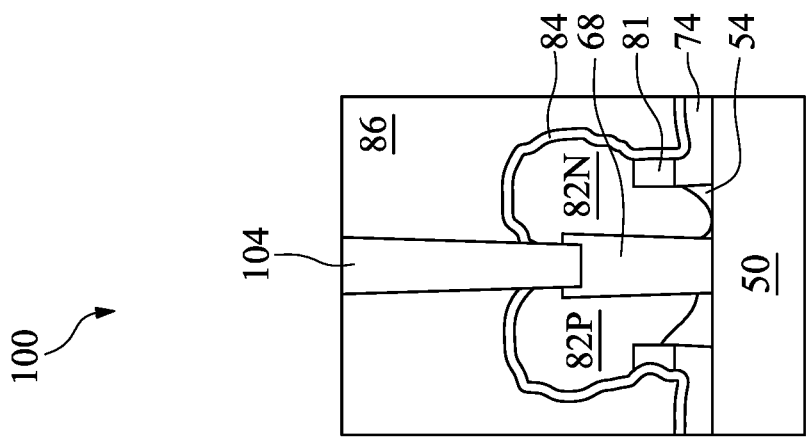
Figure 19B:
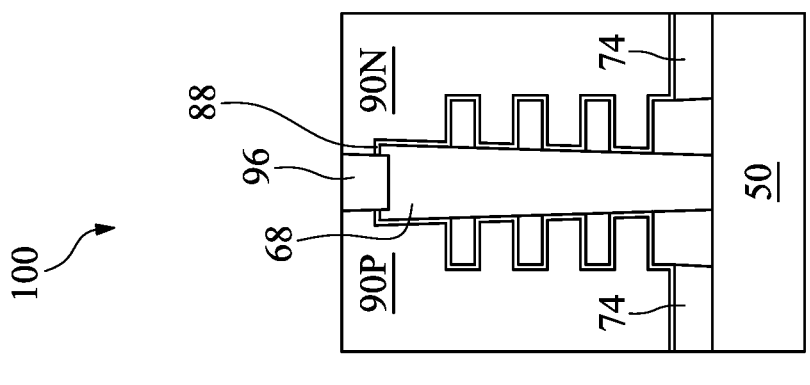
Figure 19A:
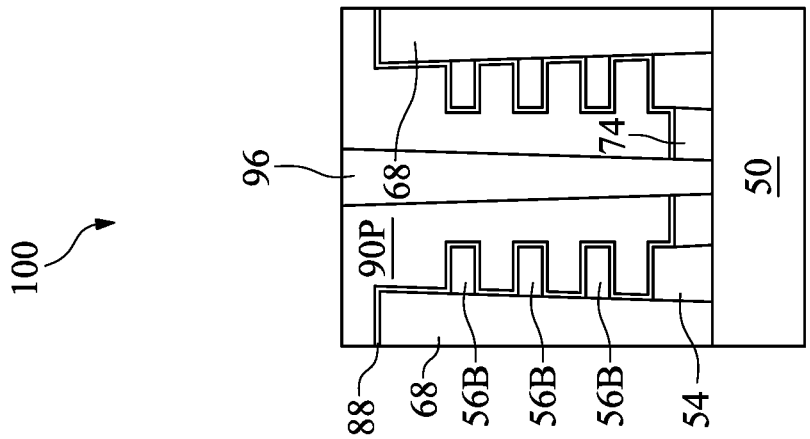

Next, as shown in FIGS. 18A, 18B, and 18C, the dielectric material 96 is formed in the openings 92, 98 to fill the openings 92, 98. The dielectric material 96 may be also formed over the hard mask layer 94. The opening 102 is then formed in the dielectric material 96, the hard mask layer 94, the ILD layer 86, the CESL 84, and the S/D regions 82P, 82N to expose the dielectric wall 68. A patterned photoresist (not shown) may be formed over the dielectric material 96 to protect the portions of the dielectric material 96. Next, as shown in FIGS. 19A, 19B, and 19C, the dielectric material 104 is formed in the opening 102 to fill the opening 102, and the planarization process is performed to expose the gate electrode layers 90N, 90P and the ILD layer 86. The process described in FIGS. 17A to 19C shows that the dielectric material 104 for separating the S/D regions 82N, 82P is formed after the CMG processes. In other words, the S/D regions 82N, 82P are separated after the CMG processes to separate the gate electrode layer 90P into two portions and to separate the gate electrode layers 90N, 90P. In some embodiments, the S/D regions 82N, 82P are separated before the CMG processes to separate the gate electrode layer 90P into two portions and to separate the gate electrode layers 90N, 90P. Subsequent processes, such as the processes described in FIGS. 14, 15, and 16, may be performed.

Figure 20C:
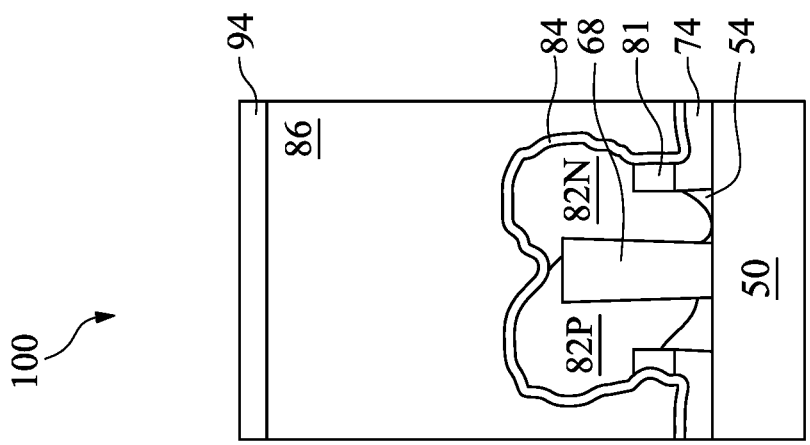
FIGS. 20C and 21C are cross-sectional side views of various stages of manufacturing the semiconductor device structure taken along line C-C of FIG. 7, in accordance with alternative embodiments.
Figure 20B:
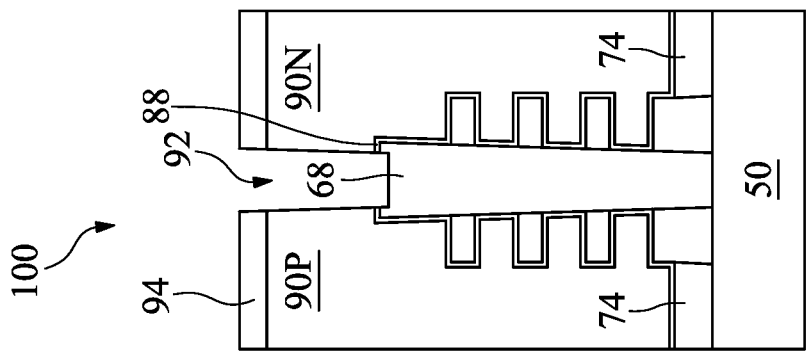
FIGS. 20B and 21B are cross-sectional side views of various stages of manufacturing the semiconductor device structure taken along line B-B of FIG. 7, in accordance with alternative embodiments.
Figure 20A:
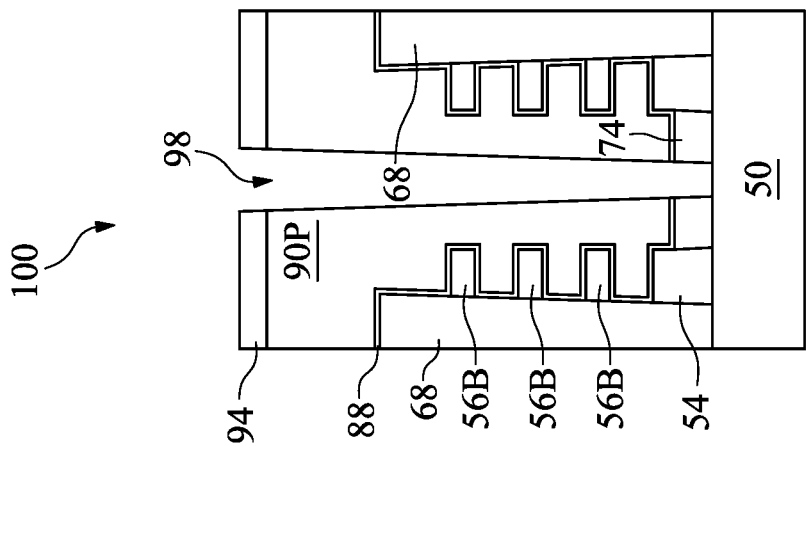
FIGS. 20A and 21A are cross-sectional side views of various stages of manufacturing the semiconductor device structure taken along line A-A of FIG. 7, in accordance with alternative embodiments.
Figure 21C:
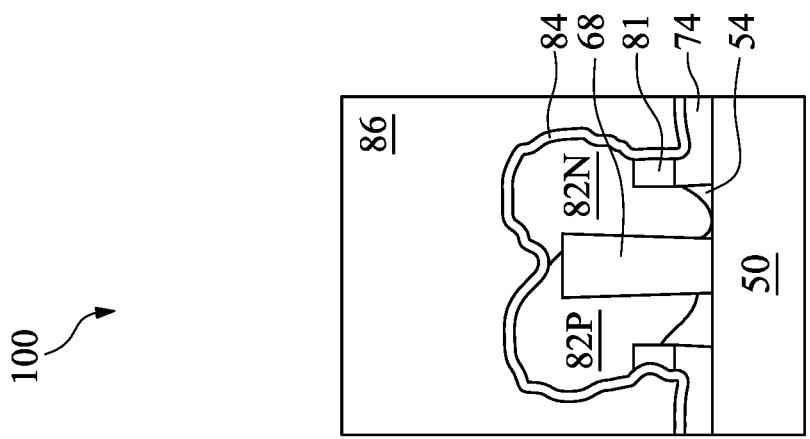
Figure 21B:
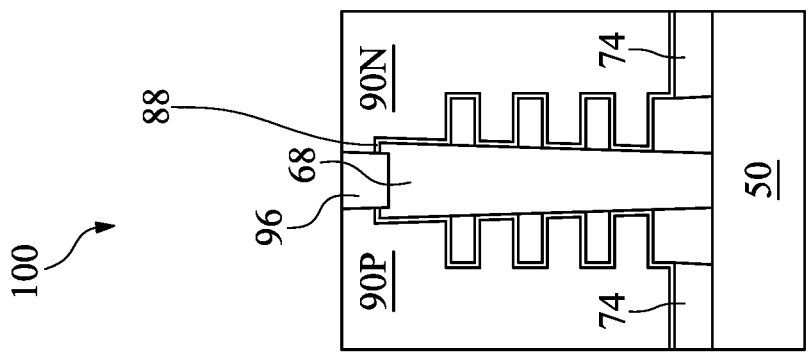
Figure 21A:
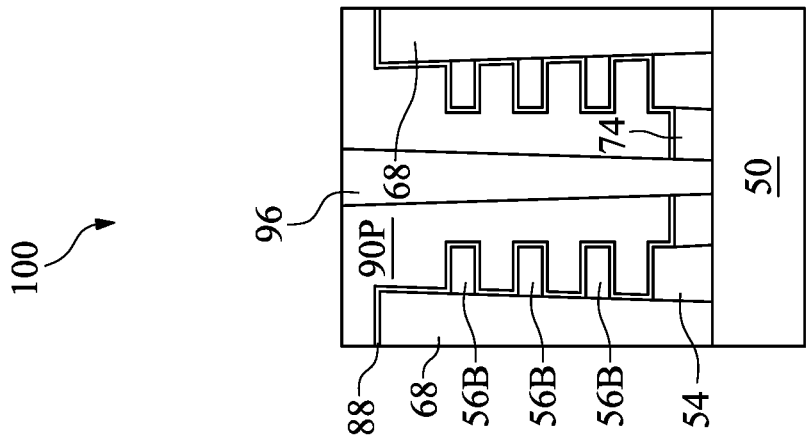

FIGS. 20A and 21A are cross-sectional side views of various stages of manufacturing the semiconductor device structure 100 taken along line A-A of FIG. 7, in accordance with alternative embodiments. FIGS. 20B and 21B are cross-sectional side views of various stages of manufacturing the semiconductor device structure 100 taken along line B-B of FIG. 7, in accordance with alternative embodiments. FIGS. 20C and 21C are cross-sectional side views of various stages of manufacturing the semiconductor device structure 100 taken along line C-C of FIG. 7, in accordance with alternative embodiments.

As shown in FIGS. 20A, 20B, and 20C, the openings 92, 98 are formed simultaneously, similar to the process described in FIGS. 17A, 17B, and 17C. Next, as shown in FIGS. 21A, 21B, and 21C, the dielectric material 96 is formed in the openings 92, 98 to fill the openings 92, 98, and a planarization process is performed to expose the gate electrode layers 90N, 90P and the ILD layer 86. As shown in FIGS. 21A and 21B, the dielectric material 96 formed between the portions of the gate electrode layer 90P has a height substantially greater than a height of the dielectric material 96 formed between the gate electrode layers 90P, 90N.

FIGS. 22-25 are cross-sectional side views of various stages of manufacturing the semiconductor device structure 100 taken along line C-C of FIG. 7, in accordance with some embodiments. As shown in FIG. 22, the etch stop layer 106 and the ILD layer 108 are formed, and a hard mask layer 120 is formed on the ILD layer 108. An opening 118 is formed in the hard mask layer 120, the ILD layer 108, the etch stop layer 106, the ILD layer 86, the CESL 84, and the S/D regions 82P, 82N to expose the dielectric wall 68. The opening 118 may be formed by any suitable process, such as one or more etch processes. A patterned photoresist (not shown) may be formed over the hard mask layer 120 to protect the portions of the hard mask layer 120.

As shown in FIG. 23, a dielectric material 122 is formed in the opening 118 to fill the opening 118, and a planarization process is performed to remove the hard mask layer 120. The dielectric material 122 may include the same material as the dielectric material 104 and may be formed by the same process as the dielectric material 104. A patterned mask layer 124 is then formed on the dielectric material 122. Next, as shown in FIG. 24, exposed portions of the ILD layer 108 are removed. Portions of the etch stop layer 106, portions of the ILD layer 86, and portions of the CESL 84 located under the exposed portions of the ILD layer 108 are also removed to expose the S/D regions 82P, 82N. The removal of the materials may be performed by any suitable process, such as one or more etch processes. In some embodiments, portions of the S/D regions 82P, 82N are also removed by the one or more etch processes.

Next, as shown in FIG. 25, the conductive contacts 112 are formed over the exposed S/D regions 82P, 82N, and the silicide layers 114 are formed between the conductive contacts 112 and the corresponding S/D regions 82P, 82N. The conductive contact has the top surface 112*t* and the bottom surface 112*b*. The dielectric material 122 includes a top surface 122*t* substantially coplanar with the top surface 112*t* of the conductive contact 112. The dielectric material 122 extends from the top surface 122*t* to a level below the bottom surface 112*b*, as shown in FIG. 25. In some embodiments, the dielectric material 122 includes a material different from the material of the ILD layer 86, and the dielectric material 122 has a height substantially greater than a height of the conductive contact 112. In some embodiments, the height of the dielectric material 122 is substantially greater than a height of the dielectric material 96 disposed between the gate electrode layers 90P, 90N (FIG. 21B). In some embodiments, the height of the dielectric material 122 is more than 30 nm greater than the height of the dielectric material 96. In some embodiments, the top surface of the dielectric material 122 is located at a level more than 15 nm higher than a level of the top surface of the dielectric material 96.

Figure 26A:
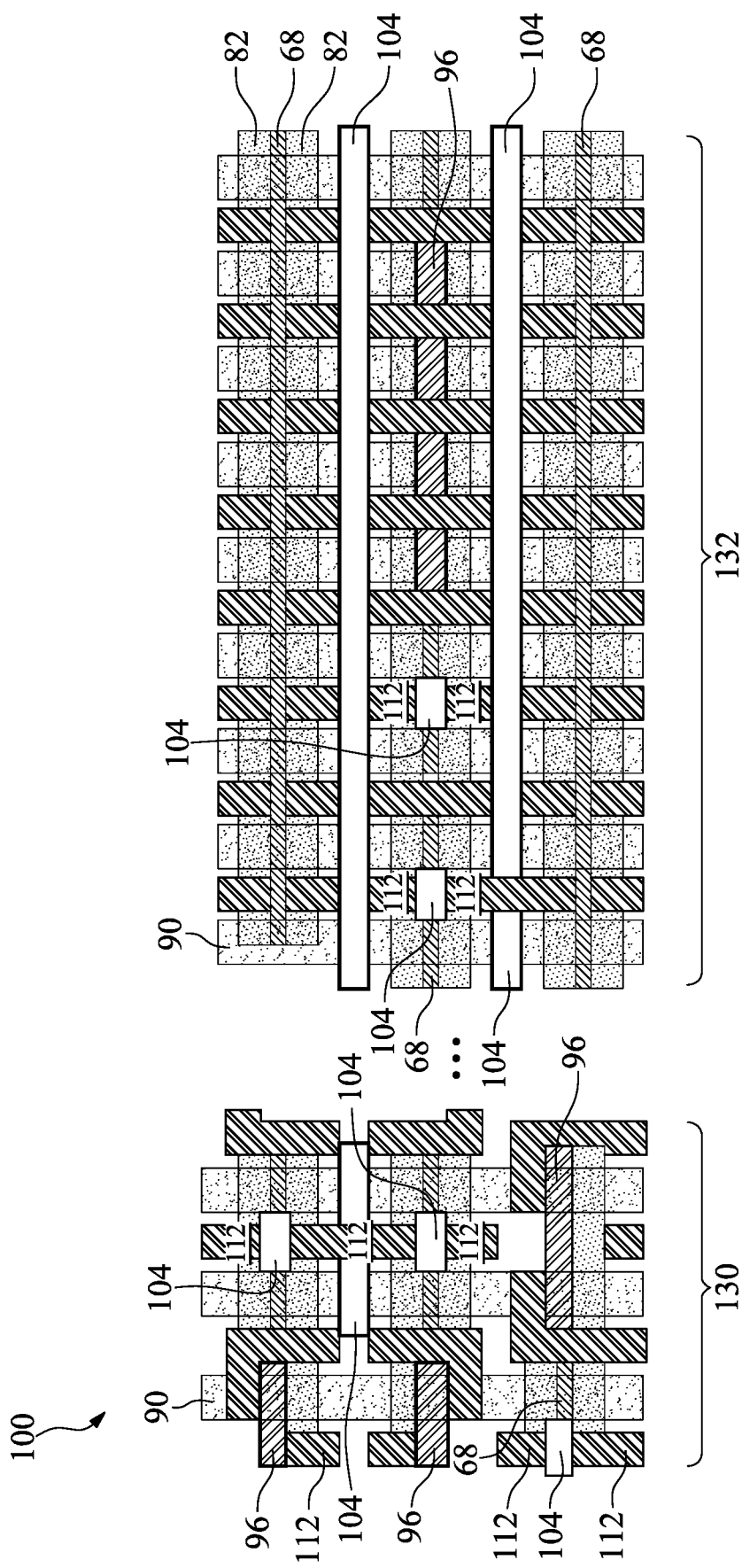
FIGS. 26A and 26B are top views of the semiconductor device structure, in accordance with some embodiments.
Figure 26B:
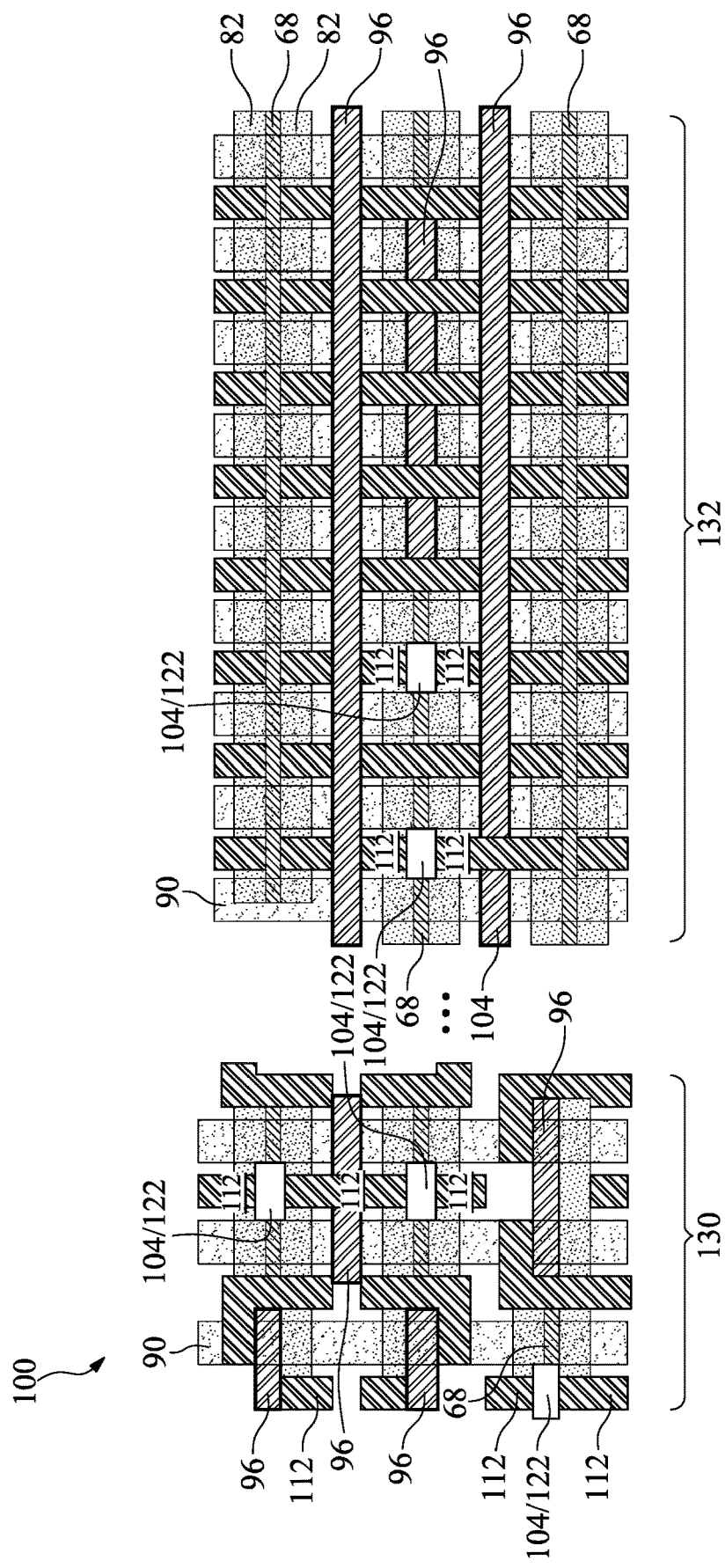

FIGS. 26A and 26B are top views of the semiconductor device structure 100, in accordance with some embodiments. As shown in FIG. 26A, semiconductor device structure 100 may include a memory region 130 and a logic region 132, and both the memory region 130 and the logic region 132 are located over the substrate 50. The dielectric materials 96, 104 may be formed in multiple locations in both regions 130, 132. Similar to the embodiment shown in FIGS. 13A to 13C, the dielectric materials 96 may be formed on the dielectric wall 68 to separate gate electrode layers 90N, 90P (collectively gate electrode layers 90), and the dielectric materials 104 may be formed on the substrate 50 to separate the gate electrode layers 90P and formed on the dielectric wall 68 to separate S/D regions 82N, 82P (collectively S/D regions 82). As shown in FIG. 26A, the dielectric material 96 may be spaced apart from the dielectric material 104.

As shown in FIG. 26B, similar to the embodiments shown in FIGS. 19A to 19C, 21A, 21B, and 25, the dielectric materials 96 may be formed on the dielectric wall 68 to separate gate electrode layers 90N, 90P and formed on the substrate 50 to separate the gate electrode layers 90P. The dielectric material 104 or 122 may be formed on the dielectric wall 68 to separate S/D regions 82N, 82P. As shown in FIG. 26B, the dielectric material 96 may be spaced apart from the dielectric material 104/122.

The present disclosure in various embodiments provides a dielectric material 104 or 122 disposed on a dielectric wall 68 to electrically separate S/D regions 82N, 82P. Some embodiments may achieve advantages. For example, the process to form the dielectric material 104 or 122 may be compatible with CMG processes (i.e., no additional masks). With the dielectric material 104 or 122 separating the S/D regions 82N, 82P, the current leakage (bridge) due to small N/P spacing (about 20 nm) for the forksheet FET may be mitigated. Furthermore, the dielectric wall 68 loss over critical dimension, S/D regions bridge, and S/D regions poor growth trade-off under the nanostructures 56B is relaxed. Lastly, the bridge window between conductive contacts 112 and between the conductive contact 112 and the corresponding S/D region 82 is enlarged.

An embodiment is a semiconductor device structure. The structure includes a first source/drain (S/D) region disposed over a substrate, a second S/D region disposed over the substrate, a dielectric wall disposed between the first and second S/D regions, a first conductive contact disposed over and electrically connected to the first S/D region, a second conductive contact disposed over and electrically connected to the second S/D region, and a first dielectric material in contact with the dielectric wall. The first dielectric material has a top surface located at a first level between a top surface of the first conductive contact and a bottom surface of the first conductive contact, and the first dielectric material extends from the first level to a second level located below the bottom surface of the first conductive contact.

Another embodiment is a semiconductor device structure. The structure includes a first source/drain (S/D) region disposed over a substrate, a second S/D region disposed over the substrate, a dielectric wall disposed between the first and second S/D regions, a first conductive contact disposed over and electrically connected to the first S/D region, a second conductive contact disposed over and electrically connected to the second S/D region, and a first dielectric material disposed between the first and second conductive contacts. The first dielectric material has a top surface substantially coplanar with a top surface of the first conductive contact, and the first dielectric material extends to a level located below a bottom surface of the first conductive contact. The structure further includes an interlayer dielectric (ILD) layer disposed under the first conductive contact, and the first dielectric material and the ILD layer include different materials.

A further embodiment is a method. The method includes forming first and second fin structures over a substrate, forming a dielectric wall between the first and second fin structures, forming a sacrificial gate structure over a portion of the first fin structure, a portion of the second fin structure, and a portion of the dielectric wall, recessing exposed portions of the first fin structure, exposed portions of the second fins structure, and exposed portions of the dielectric wall, and forming first and second source/drain (S/D) regions from the recessed first and second fins. The first S/D region is in contact with the second S/D region at a location over the dielectric wall. The method further includes forming an interlayer dielectric (ILD) layer over the first and second S/D regions, forming a first opening in the ILD layer and the first and second S/D regions to expose the dielectric wall, and forming a dielectric material in the first opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:
a first source/drain (S/D) region disposed over a substrate;
a second S/D region disposed over the substrate;
a dielectric wall disposed between the first and second S/D regions;
a first conductive contact disposed over and electrically connected to the first S/D region;
a second conductive contact disposed over and electrically connected to the second S/D region; and
a first dielectric material in contact with the dielectric wall, wherein the first dielectric material has a top surface located at a first level between a top surface of the first conductive contact and a bottom surface of the first conductive contact, and the first dielectric material extends from the first level to a second level located below the bottom surface of the first conductive contact.

2. The semiconductor device structure of claim 1, wherein the first dielectric material is disposed in a recess in the dielectric wall.

3. The semiconductor device structure of claim 2, further comprising an interlayer dielectric (ILD) layer, wherein the first and second conductive contacts are disposed over the ILD layer.

4. The semiconductor device structure of claim 3, wherein the first dielectric material and the ILD layer comprise different materials.

5. The semiconductor device structure of claim 1, wherein the dielectric wall comprises a first portion located between the first and second S/D regions and a second portion located between first and second gate electrode layers.

6. The semiconductor device structure of claim 5, wherein the second portion of the dielectric wall has a height substantially greater than a height of the first portion of the dielectric wall.

7. The semiconductor device structure of claim 5, further comprising a second dielectric material disposed on the second portion of the dielectric wall, wherein the second dielectric material is spaced apart from the first dielectric material.

8. A semiconductor device structure, comprising:
a first source/drain (S/D) region disposed over a substrate;
a second S/D region disposed over the substrate;
a dielectric wall disposed between the first and second S/D regions;
a first conductive contact disposed over and electrically connected to the first S/D region;
a second conductive contact disposed over and electrically connected to the second S/D region;
a first dielectric material disposed between the first and second conductive contacts, wherein the first dielectric material has a top surface substantially coplanar with a top surface of the first conductive contact, and the first dielectric material extends to a level located below a bottom surface of the first conductive contact; and
an interlayer dielectric (ILD) layer disposed under the first conductive contact, wherein the first dielectric material and the ILD layer comprise different materials.

9. The semiconductor device structure of claim 8, wherein the dielectric wall comprises a first portion located between the first and second S/D regions and a second portion located between first and second gate electrode layers.

10. The semiconductor device structure of claim 9, wherein the second portion of the dielectric wall has a height substantially greater than a height of the first portion of the dielectric wall.

11. The semiconductor device structure of claim 10, further comprising a second dielectric material disposed on the second portion of the dielectric wall, wherein the second dielectric material is spaced apart from the first dielectric material.

12. The semiconductor device structure of claim 11, wherein the second dielectric material has a top surface, and the top surface of the first dielectric material is located at a level more than 15 nm greater than a level of the top surface of the second dielectric material.

13. The semiconductor device structure of claim 11, wherein the first dielectric material has a first height, and the second dielectric material has a second height substantially less than the first height.

14. The semiconductor device structure of claim 13, wherein the first height is more than 30 nm greater than the second height.

15. The semiconductor device structure of claim 13, further comprising a third dielectric material located between portions of a third gate electrode layer.

16. The semiconductor device structure of claim 15, wherein the third dielectric material has a third height substantially greater than the second height.

17. A method, comprising:
  forming first and second fin structures over a substrate;
  forming a dielectric wall between the first and second fin structures;
  forming a sacrificial gate structure over a portion of the first fin structure, a portion of the second fin structure, and a portion of the dielectric wall;
  recessing exposed portions of the first fin structure, exposed portions of the second fins structure, and exposed portions of the dielectric wall;
  forming first and second source/drain (S/D) regions from the recessed first and second fins, wherein the first S/D region is in contact with the second S/D region at a location over the dielectric wall;
  forming an interlayer dielectric (ILD) layer over the first and second S/D regions;
  forming a first opening in the ILD layer and the first and second S/D regions to expose the dielectric wall; and
  forming a dielectric material in the first opening.

18. The method of claim 17, further comprising:
  removing the sacrificial gate structure; and
  forming first and second gate electrode layers, wherein the first and second gate electrode layers are disposed over the portion of the first fin structure, the portion of the second fin structure, and the portion of the dielectric wall.

19. The method of claim 18, further comprising forming a second opening in the first and second gate electrode layers to expose the portion of the dielectric wall.

20. The method of claim 19, wherein the second opening is formed before the first opening.

* * * * *